United States Patent
Gavrilescu et al.

(10) Patent No.: US 7,356,085 B2
(45) Date of Patent: Apr. 8, 2008

(54) EMBEDDED MULTIPLE DESCRIPTION SCALAR QUANTIZERS FOR PROGRESSIVE IMAGE TRANSMISSION

(75) Inventors: Augustin Ion Gavrilescu, Etterbeek (BE); Adrian Munteanu, Elsene (BE)

(73) Assignees: Interuniversitair Microelectronica Centrum (IMEC), Leuven (BE); Vrije Universiteit Brussel, Brussels (BE)

( * ) Notice: Subject to any disclaimer, the term of this patent is extended or adjusted under 35 U.S.C. 154(b) by 621 days.

(21) Appl. No.: 10/813,811

(22) Filed: Mar. 30, 2004

(65) Prior Publication Data
US 2005/0027521 A1 Feb. 3, 2005

(30) Foreign Application Priority Data
Mar. 31, 2003 (EP) .................................. 03447073

(51) Int. Cl.
*H04B 14/06* (2006.01)
(52) U.S. Cl. ..................................................... 375/245
(58) Field of Classification Search ................ 375/245, 375/244, 242, 295, 316; 382/232, 248
See application file for complete search history.

(56) References Cited

U.S. PATENT DOCUMENTS 6,611,624 B1 * 8/2003 Zhang et al. ................ 382/232

OTHER PUBLICATIONS

Taubman et al., "JPEG2000 Image Compression Fundamentals, Standards and Practice", (2001) Chapter 3, pp. 87-115.
Goyal, Beyond Traditional Transform Coding, (1998) pp. 1-222.
Munteanu et al., "A Wavelet Based Lossless Compression Scheme with Progressive Transmission Capability", (1999) pp. 1-28.
Jiang et al., "Multiple Description Coding Via Polyphase Transform and Selective Quantization", (1999) pp. 1-11.
Gamal et al., "Achievable Rates for Multiple Descriptions", (1982) IEEE Transactions on Information Theory IT-28(6):851-857.
Vaishampayan, "Design of Multiple Description Scalar Quantizers", (1993) IEEE Transactions on Information Theory, 39(3):821-834.
Vaishampayan et al., "Design of Entropy-Constrained Multiple-Description Scalar Quantizers", (1994) IEEE Transactions on Information Theory, 40(1):245-249.
Batllo et al., "Asymptotic Performance of Multiple Description Transform Codes", (1997) IEEE Transaction on Information Theory, 43(2):703-707.
Goyal et al., "Multiple Description Transform Coding of Images", (1998) IEEE Transactions on Information Theory, pp. 674-678.
Guionnet et al., "Embedded Multiple Description Coding for Progressive Image Transmission over Unreliable Channels", (2001) IEEE Transactions on Information Theory, pp. 94-97.

* cited by examiner

*Primary Examiner*—Khai Tran
(74) *Attorney, Agent, or Firm*—Knobbe Martens Olson & Bear LLP

(57) ABSTRACT

A method and a device for transmission and/or reception of digital signals are disclosed. In one embodiment, the method comprises quantizing a source digital signal to generate with different quantizations at least a first and a second bit-stream, of which at least one bit-stream is generated by an embedded quantization, transmitting at least one of the at least first and second bit-streams and generating a dequantized digital signal from at least parts of one of the transmitted at least first and second bit streams, whereby if in the generation of the dequantized digital signal the parts of the at least first and second bit-streams are combined, the combined dequantized signal is generated by an embedded dequantizer having at least two quantization levels and having at least one quantization interval at each quantization level which is finer than quantization intervals for dequantizing any of the at least first and second bit-streams.

27 Claims, 13 Drawing Sheets

| Image | Quant. | 0.125 | 0.25 | 0.5 | 1 | 2 | 4 |
|---|---|---|---|---|---|---|---|
| barb.raw | EMDSQ | 23.90 | 25.72 | 28.52 | 32.56 | 37.75 | 44.52 |
| | MDUSQ | 23.63 | 24.87 | 28.20 | 32.16 | 37.15 | 42.85 |
| bird.raw | EMDSQ | 30.98 | 34.31 | 37.94 | 41.46 | 44.82 | 50.04 |
| | MDUSQ | 30.15 | 33.40 | 37.15 | 40.66 | 43.78 | 48.88 |
| boat.raw | EMDSQ | 26.09 | 28.48 | 31.23 | 34.84 | 39.72 | 44.92 |
| | MDUSQ | 25.62 | 27.73 | 30.46 | 33.85 | 38.30 | 43.80 |
| camera.raw | EMDSQ | 23.32 | 25.26 | 28.08 | 31.78 | 37.06 | 44.43 |
| | MDUSQ | 22.59 | 24.80 | 27.50 | 30.87 | 36.21 | 43.08 |
| mandrill.raw | EMDSQ | 20.99 | 21.90 | 23.51 | 25.97 | 29.59 | 35.50 |
| | MDUSQ | 20.59 | 21.57 | 22.91 | 25.25 | 28.94 | 34.51 |
| average mean diff. | | 0.54 | 0.66 | 0.61 | 0.76 | 0.91 | 1.25 |

Fig. 7

EMBEDDED MULTIPLE DESCRIPTION SCALAR QUANTIZERS FOR PROGRESSIVE IMAGE TRANSMISSION

BACKGROUND OF THE INVENTION

1. Field of the Invention

The present invention relates to communication of digital signals, more particularly to a method and a device for transmission and/or reception of digital signals using diversity (e.g. Multiple Description Coding—MDC) to overcome channel impairments, as well as to the signals themselves and a network for transmitting and receiving the signals

2. Description of the Related Technology

A new family of communication services involving the delivery of image data over bandwidth limited and error prone channels as packet networks and wireless links has emerged in the last few years. In order to increase the reliability over these types of channels, diversity is commonly resorted to, besides error correction techniques. Multiple Description Coding (MDC) has been introduced to efficiently overcome channel impairments over diversity-based systems allowing decoders to extract meaningful information from a subset of a bit-stream.

In his PhD. Thesis, which can be found in electronic format on http://lcavwww.epfl.ch/~goyal/Thesis/, Vivek K. Goyal offers an overview of MDC in general and achievable rate-distortion regions. The focus of previous research was laid on finding the optimal achievable rate-distortion regions and their boundaries, as described in L. Ozarow, "On a source coding problem with two channels and tree receivers," *Bell Syst. Tech. J.*, vol. 59, pp. 1909-1921, 1980, and in A. A. El Gamal and T. M. Cover, "Achievable rates for multiple descriptions," *IEEE Trans. Inform. Th.*, vol. IT-28, no. 6, pp. 851-857, 1982. This is followed by the design of practical compression systems to meet these theoretical boundaries. Examples include methods based on quantization as described in V. A. Vaishampayan, "Design of multiple description scalar quantizers," *IEEE Trans. Inform. Th.*, vol. 39, no. 3, pp. 821-834, 1993, and in V. A. Vaishampayan and J. Domaszewicz, "Design of entropy-constrained multiple description scalar quantizers," *IEEE Trans. Inform. Theory*, vol. 40, no. 1, pp. 245-250, 1994, and methods based on multiple description transform as described in J. Batllo and V. Vaishampayan, "Asymptotic performance of multiple description transform codes," *IEEE Trans. Inform. Theory*, vol. 43, no. 2, pp. 703-707, 1997, and in V. Goyal, J. Kovacevic, R. Arean, and M. Vetterli, "Multiple description transform coding of images," *Proc. IEEE Int. Conf Image Proc.* ICIP'98, pp. 674-678, 1998. A design of Multiple Description Scalar Quantizers (MDSQ) is pioneered in V. A. Vaishampayan, "Design of multiple description scalar quantizers," *IEEE Trans. Inform. Th.*, vol. 39, no. 3, pp. 821-834, 1993 under an assumption of fixed length codes and fixed codebook sizes. Significant improvements are achieved in V. A. Vaishampayan and J. Domaszewicz, "Design of entropy-constrained multiple description scalar quantizers," *IEEE Trans. Inform. Theory*, vol. 40, no. 1, pp. 245-250, 1994 where the design of the quantizers is subject to the constraint of a given entropy, and not of a given codebook size.

In order to achieve robust communication over unreliable channels the MDC system has to deliver highly error-resilient bit-streams characterised by a corresponding high level of redundancy. Additionally, a fine grain scalability of the bit-stream is a desirable feature for bandwidth varying channels. A system conceived so as to meet these requirements is described in T. Guionnet, C. Guillemot, and S. Pateux, "Embedded multiple description coding for progressive image transmission over unreliable channels," *Proc. IEEE Int. Conf Image Proc.*, ICIP 2001, pp. 94-97, 2001, where a progressive MDC algorithm is based on Multiple Description Uniform Scalar Quantizers (MDUSQ). Moreover, for a high level of redundancy and for low bit-rates, the approach of this document outperforms the embedded MDC algorithm based on a polyphase transform as proposed in W. Jiang and A. Ortega, "Multiple description coding via polyphase transform and selective quantization," *Proc. SPIE Int. Conf Visual Comm. Image Proc.*, VCIP'99, San Jose, USA, pp. 998-1008, 1999.

The system proposed in V. A. Vaishampayan, "Design of multiple description scalar quantizers," *IEEE Trans. Inform. Th.*, vol. 39, no. 3, pp. 821-834, 1993, relies on the ability to design scalar quantizers with nested thresholds. A source signal or input signal, generally called "a source", represented by a random process $\{X_n, n \in z_{30}\}$ with zero mean and variance $\sigma_X^2$ is quantized by side quantizers $Q_S^m: R \rightarrow \{0,1,\ldots,K-1\}$, m being a value between 1 and the number of side quantizers available, for example m=1, 2, and K being the number of quantization intervals of a side quantizer for a quantization level. In the example given with two side quantizers, each of the two quantizers outputs an index $q_k^m, k \in z_+$ for a quantization level, which indexes can be separately used to estimate the source sample. A reconstruction where $Q_S^m(x) = q_k^m$ must be the centroid of the cell or quantization interval $Q_S^{m-1}(q_k^m)$. If both indices $Q_C^1(x) = q_k^1$ and $Q_S^2(x) = q_k^2$ are received, the reconstruction is the centroid of the intersection $Q_C^{-1}(q_k^1, q_k^2) = Q_S^{1-1}(q_k^1) \cap Q_S^{2-1}(q_k^2)$ represented by the central inverse quantizer. The number of diagonals covered in the index assignment matrix triggers the redundancy between the two descriptions, as described in V. A. Vaishampayan, "Design of multiple description scalar quantizers," *IEEE Trans. Inform. Th.*, vol. 39, no. 3, pp. 821-834, 1993.

Quantization methods based on embedded scalar quantizers are previously proposed in the literature—see for e.g. D. Taubman and M. W. Marcellin, *JPEG2000—Image Compression: Fundamentals, Standards and Practice*. Hingham, Mass.: Kluwer Academic Publishers, 2001. In embedded quantization, the partition cells or quantization intervals at higher quantization rates are embedded in the quantization intervals at lower rates. A quantization rate relates to the number of quantization intervals at a quantization level. A set of embedded side quantizers $Q_S^{m,0}, Q_S^{m,1}, \ldots, Q_S^{m,P}$ with m=1,2 the number of side quantizers, and P+1 the number of quantization levels, and a set of embedded central quantizers $Q_C^0, Q_C^1, \ldots, Q_C^P$ where $Q_C^{P-1}(q_k^1, q_k^2) = Q_S^{1,p-1}(q_k^1) \cap Q_S^{2,p-1}(q_k^2)$ for any quantization level p, $0 \leq p \leq P$ are assumed. The number of quantization levels may be freely selected e.g. seven or more or ten or more levels. The quantization intervals of any quantizer $Q_S^{m,p}$ and $Q_C^p$ are embedded in the quantization intervals of the quantizers $Q_S^{m,P}, Q_S^{m,P-1}, \ldots, Q_S^{m,P+1}$ and $Q_C^P, Q_C^{P-1}, \ldots, Q_C^{P+1}$ respectively. It is considered that the quantizer at level p (e.g. $Q_S^{m,p}$) is finer than the quantizer at level p+1 (e.g. $Q_S^{m,p+1}$) if at least one of the quantization intervals of the quantizer at level p+1 is split into at least two quantization intervals at level p.

The number of side quantization intervals of the lowest-rate quantizer $Q_S^{m,P}$ is denoted by N and the number of quantization intervals in which an arbitrary side quantization interval $S_k^{m,p}$ of $Q_S^{m,p}$ is divided is denoted by $L_k$. The maximum number of intervals in which any side quantization interval $S_k^{m,p}$ is partitioned over all quantization levels is denoted by $N_p$, with $L_k \leq N_p$ for any k. Starting from the lowest-rate quantizer $Q_S^{m,P}$, each side quantization interval $S_{k_p}^{m,P}$, $0 \leq k_p < N$ is divided into a number of $L_{k_p}$ quantization intervals $S_{k_p,k_{p-1}}^{m,P-1}$, $0 \leq k_{P-1} < L_{k_p}$ of $Q_S^{m,P-1}$. In general, for each side-quantizer $Q_S^{m,p}$ one associates to any $x \in S_{k_p,k_{p-1}}, \ldots, k_p^{m,p}$ the quantizer index $k_p, k_{p-}, \ldots, k_p$. This allows to obtain the indices of lower rate quantization by leaving aside components of higher rate quantization, similar to the uniform embedded scalar quantizers as described in D. Taubman and M. W. Marcellin, JPEG2000—*Image Compression: Fundamentals, Standards and Practice*. Hingham, MA: Kluwer Academic Publishers, 2001.

SUMMARY OF CERTAIN ASPECTS OF THE INVENTION

One aspect of the invention provides a method and device for robust progressive image transmission of encoded digital signals over unreliable channels with variable bandwidth which yield a better rate-distortion performance compared to known Multiple Description Uniform Scalar Quantizers (MDUSQ). The signals may correspond to detectable physical quantities, such as, but not limited to, pressures, voltages, magnetic field strengths, photon energies and counts, that capture conditions at a particular time and place. Communication or transmission of those signals allows for sight and sound reproduction. In one embodiment, a type of embedded scalar quantizers for Multiple Description Coding (MDC) systems are introduced, which are referred to as Embedded Multiple Description Scalar Quantizers (EMDSQ) hereinafter.

Another aspect of the invention provides an Embedded Multiple Description Scalar Quantizer (EMDSQ) which provides a fine-grain refinable representation of the input data and are designed, for example, under the constraint of producing double-deadzone central quantizers at each quantization level. The term double deadzone is usually used with uniform quantizers to indicate that the size of the central partition about zero is equal to the double of the size of the other partitions. In one embodiment, non-uniform partitioning can be used and the term double deadzone is extended to include central partitions so that the double deadzone is within 1.5 to 2.5 times the other partitions. Moreover, in one embodiment, a control mechanism for the EMDSQ is provided which allows for tuning the descriptions' redundancy for each quantization level.

In one embodiment, the employed mechanism enables:
(1) to control the tradeoff between coding efficiency and resilience to errors, and
(2) to improve the resilience by increasing the redundancy in the important layers of the bit-streams thus resulting in improved experimental results.

In one embodiment, the control mechanism allows for tuning the redundancy between the two or more descriptions for each quantization level. The employed mechanism enables the control of the tradeoff between the coding efficiency and error-resilience, and provides an increased robustness by improving the error resilience in the most important layers of the embedded bit-streams. Instantiations of the proposed family, for example can be incorporated in a wavelet-based embedded coding system having a redundancy-control mechanism.

In one embodiment, the EMDSQ meets features desired for robust progressive image transmission over unreliable channels, such as for example a high redundancy level, fine grain rate adaptation and progressive transmission of each description. For an erasure channel model characterised by burst errors, progressive transmission also provides quality improvement for the central reconstruction due to the use of undamaged data from partially damaged received side channels. The reconstruction of the central channel can be performed if the receiver knows where the burst error occurs. To satisfy this requirement, techniques such as inserting synchronisation markers in the bit-stream can be used.

In one embodiment, the EMDSQ may be incorporated in any suitable coding system such as a DCT coding or, for example, a wavelet-based coding system that employs a Quad Tree (QT) coding algorithm as described in A. Munteanu, J. Cornelis, G. Van der Auwera, and P. Cristea, "Wavelet-based lossless compression scheme with progressive transmission capability," *Int. J. Imaging Systems and Tech.*, vol. 10, no. 1, pp. 76-85, January 1999.

One aspect of the invention provides a method for transmitting a digital signal, the method comprising quantizing a source digital signal to generate with different quantizations at least a first and a second bit-stream, of which at least one bit-stream has been generated by an embedded quantization, transmitting at least one of the at least first and second bit-streams and generating a dequantized digital signal from at least parts of one of the transmitted at least first and second bit streams, whereby if in the generation of the dequantized digital signal the parts of the at least first and second bit-streams are combined; the combined dequantized signal is generated by an embedded dequantizer having at least two quantization levels and having at least one quantization interval at each quantization level which is finer than quantization intervals for dequantizing any of the at least first and second bit-streams.

Each quantization level has a quantization rate. A quantization rate corresponds to the number of quantization intervals a digital signal is divided into at a certain quantization level. At least one bit-stream generated by an embedded quantization may be generated by an embedded quantization where at least two quantization intervals at lower quantization rate are split into a different number of quantization intervals at higher quantization rate. At least one bit-stream generated by an embedded quantization may be generated by a non-uniform embedded quantization. At least one bit-stream generated by a non-uniform embedded quantization may be generated by a non-uniform embedded dead zone quantization. At least one bit-stream generated by a non-uniform embedded dead zone quantization is generated by a non-uniform embedded double dead zone quantization.

Alternatively, at least one bit-stream generated by an embedded quantization may be generated by a uniform embedded quantization. At least one bit-stream generated by a uniform embedded quantization may be generated by a uniform embedded dead zone quantization. At least one bit-stream generated by a uniform embedded dead zone quantization may be generated by a uniform embedded double dead zone quantization.

Instead of one or more bit-streams, each bit-stream may be generated by an embedded quantization.

Another aspect of the invention comprises selecting end points of quantization intervals of a quantizer such that at least one of the end points does not coincide with end points of a quantization interval of another quantizer. The embedded quantization may comprise at least three levels, preferably more than seven levels, and still more preferred more than ten levels. The quantizing of the source digital signal may comprise an embedded successive approximation quantization at every quantization level.

Another aspect of the invention provides a device for transmitting a digital signal. The device comprises a quantizing means for quantizing a source digital signal to generate with different quantizations at least a first and a second bit-stream, of which at least one bit-stream has been generated by an embedded quantization, and transmitting means for transmitting at least one of the at least first and second bit-streams. The quantizing means are such that when a dequantized digital signal is generated from at least parts of one of the transmitted at least first and second bit streams, if in the generation of the dequantized digital signal the parts of the at least first and second bit-streams are combined, the combined dequantized signal is generated by an embedded dequantizer having at least two quantization levels and having at least one quantization interval at each quantization level which is finer than quantization intervals for dequantizing any of the at least first and second bit-streams.

At least one bit-stream generated by an embedded quantization may be generated by an embedded quantizer where at least two quantization intervals at lower quantization rate are split in a different number of quantization intervals at higher quantization rate. At least one bit-stream generated by an embedded quantizer may be generated by a non-uniform embedded quantizer. At least one bit-stream generated by a non-uniform embedded quantizer may be generated by a non-uniform embedded dead zone quantizer. At least one bit-stream generated by a non-uniform embedded dead zone quantizer may be generated by a non-uniform embedded double dead zone quantizer.

Alternatively, in one embodiment, a device may be such that at least one bit-stream generated by an embedded quantizer is generated by a uniform embedded quantizer. At least one bit-stream generated by a uniform embedded quantizer may be generated by a uniform embedded dead zone quantizer. At least one bit-stream generated by a uniform embedded dead zone quantizer may be generated by a uniform embedded double dead zone quantizer.

Each bit-stream may be generated by an embedded quantizer.

The quantizing means may include means for selecting end points of quantization intervals of a quantization such that at least one of the end points does not coincide with end points of a quantization interval of another quantizer.

The embedded quantization may comprise at least three levels, preferably more than seven levels, and still more preferred more than ten levels.

The quantizing means may comprise an embedded successive approximation quantizer for carrying out an embedded successive approximation quantization at every quantization level.

In one embodiment, a device may be located in a node of a telecommunications network.

Another aspect of the invention provides a device for receiving a digital signal. The device comprises receiving means for receiving at least a first and a second bit-stream, and dequantizing means for generating a dequantized digital signal from the received first and second bit-streams. The dequantizing means comprise combining means for combining, in the generation of the dequantized digital signal, the at least first and second bit-streams, the combined dequantized signal being generated by an embedded dequantizer having at least two quantization levels and having at least one quantization interval at each quantization level which is finer than quantization intervals for dequantizing any of the at least first and second bit-streams.

At least one of the first and the second bit-streams may be generated by an embedded quantizer where at least two quantization intervals at lower quantization rate are split in a different number of quantization intervals at higher quantization rate. At least one of the first and second bit-streams generated by an embedded quantizer may be generated by non-uniform embedded quantizer. At least one of the first and second bit-streams generated by a non-uniform embedded quantizer may be generated by a non-uniform embedded dead zone quantizer. At least one of the first and second bit-streams generated by a non-uniform embedded dead zone quantizer may be generated by a non-uniform embedded double dead zone quantizer.

At least one of the first and second bit-streams generated by an embedded quantizer may be generated by a uniform embedded quantizer. At least one of the first and second bit-streams generated by a uniform embedded quantizer may be generated by a uniform embedded dead zone quantizer. At least one of the first and second bit-streams generated by a uniform embedded dead zone quantizer may be generated by a uniform embedded double dead zone quantizer.

Each bit-stream is generated by an embedded quantizer.

The dequantizing means may comprise at least three levels, preferably more than seven levels, and still more preferred more than ten levels.

In one embodiment, a device may be located in a node of a telecommunications network.

Another aspect of the invention provides two or more signals generated by any of the methods as described above.

Another aspect of the invention provides a telecommunications network comprising a device as described above. Another aspect of the invention provides a software product such as a computer program product, which when executed on a computing device executes any of the methods according to embodiments of the present invention. In one embodiment, this software product is stored on a signal medium such as an optical or magnetic disk or a magnetic tape or similar. In one embodiment, the quantizers may have one or more of the following properties:

1. Multiple Description Scalar Quantizers are provided for communication systems using diversity to overcome channel impairments. The Multiple Description Scalar Quantizers are Embedded. Hence, the name Embedded Multiple Description Scalar Quantizers.
2. The quantizer corresponding to the central channel can be embedded uniform with deadzone. This design propriety enables EMDSQ to outperform the state of the art.
3. For example, the deadzone can be equal to the uniform partitions resulting in a uniform quantizer.
4. Or alternatively, the deadzone can be the double of the uniform partitions resulting in a double deadzone uniform quantizer.
5. The design of EMDSQ allows construction of embedded side quantizers with the following propriety: two partition cells at one quantization level can be divided into a different number of partitions at a higher quantization level.
6. In one embodiment, an EMDSQ can possess a redundancy control mechanism for each quantization level. This is an extra feature from the previous overall control of redundancy.

These and other characteristics, features and advantages of embodiments of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

BRIEF DESCRIPTION OF THE DRAWINGS

FIG. 7 illustrates performance (PSNR in dB) of the central reconstruction of MD-QT coding based on EMDSQ according to an embodiment of the present invention compared to the one based on MDUSQ for bit rates ranging from 0.125 to 4 bpp.

DETAILED DESCRIPTION OF CERTAIN EMBODIMENTS OF THE INVENTION

Figure 1A:
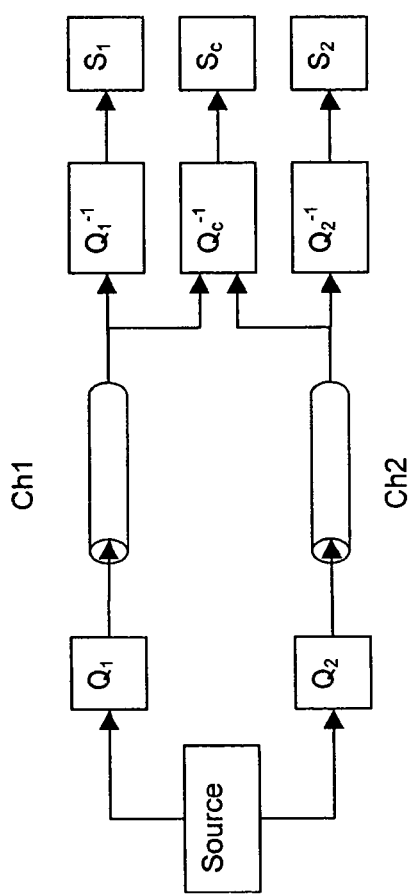
FIG. 1A illustrates the basic principle of multiple description coding using classical fixed-rate scalar quantizers.

The invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, any terms such as first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Throughout the specification, the terms "EMDSQ" and "MDC" represent embedded multiple description scalar quantizers and multiple description coding, respectively. The terms MDSQ, MD-QT and MDUSQ represent multiple description scalar quantizers, multiple description-quad tree and multiple description uniform scalar quantizers, respectively. In addition, the terms PDF, PSNR and SDC represent probability density function, peak signal to noise ratio and single-description coder, respectively.

Figure 8:
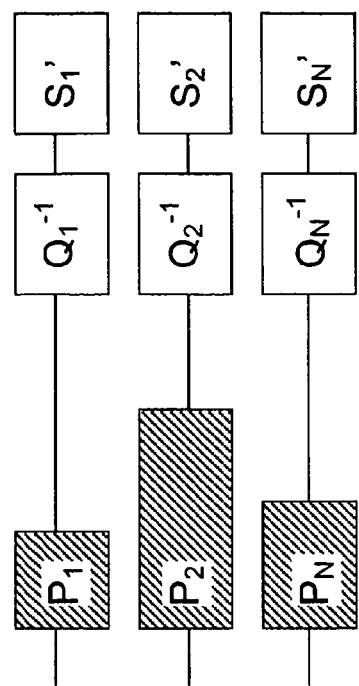
FIG. 8 illustrates a transmission system according to an embodiment of the present invention, with at the transmitter side a plurality of quantizers for generating with different quantizations, from a source digital signal, a plurality of bit-streams, and with at the receiver side a plurality of dequantizers for generating, from at least partially received bit-streams, a plurality of inverse quantized bit-streams which may be combined to obtain a better approximation of the source signal.
Figure 8:
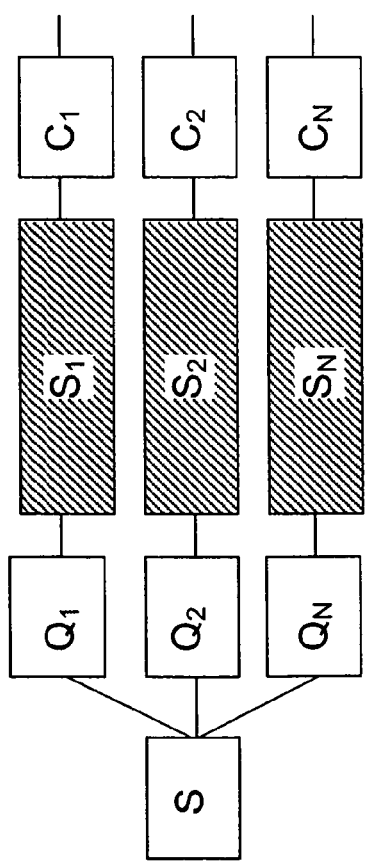
Figure 9:
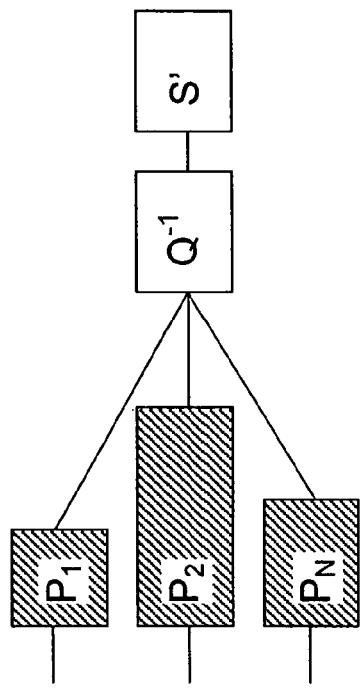
FIG. 9 illustrates a transmission system according to another embodiment of the present invention, with at the transmitter side a quantizer for generating with different quantizations, from a source digital signal, a plurality of bit-streams, and with at the receiver side a combined central dequantizer for generating, from at least partially received bit-streams, a combined inverse quantized bit-stream.
Figure 9:
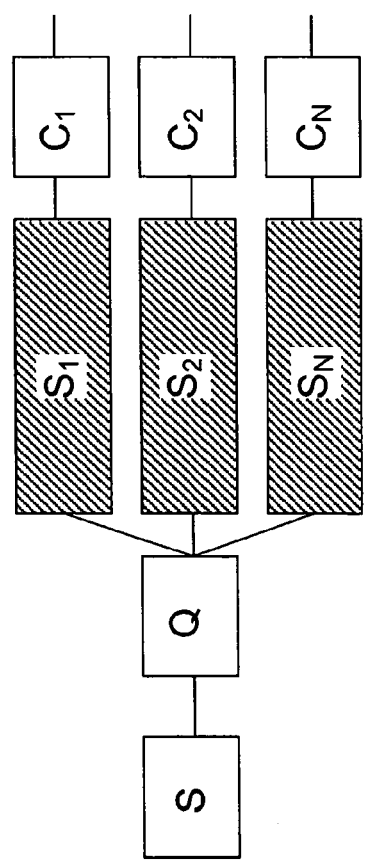

The present invention relates to data communication, more particularly to transmission of multiple bit-streams over a channel or over a plurality of channels, whereby each bit-stream in itself can reconstruct an approximation of the original data, for example an approximation of the original image if the source data is image data. Hence, one aspect of the invention does not require that all digital streams be used to create the original signal at a receiver. However, for a dispersive or noisy environment, the more bit-streams that are received and combined with each other, the better the reconstructed data, e.g. image is likely to be. Each, or at least a plurality, of the bit-streams are quantized in a different way. The process according to one embodiment of the present invention is illustrated in FIG. 8 and in FIG. 9. The inverse quantization, that is dequantization may be done in separate quantizer for each bit stream or in a single quantizer for all the streams.

At the sender or transmitter side of a transmission system, or at any intermediate part or node of the system where quantization is required, a source digital signal S, such as e.g. a source video signal (an image), or more generally any type of input data to be transmitted, is quantized in a quantizer Q, or in a plurality of quantizers $Q_1, Q_2, \ldots, Q_N$, so as to form a number of N bit-streams $S_1, S_2, \ldots, S_N$. The source signal can be a function of one or more continuous or discrete variables, and can itself be continuous or descrete-valued. The generation of bits from a continuous-valued source inevitably involves some form of quantization, which is simply an approximation of a quantity with an element chosen from a discrete set. Each of the generated N bit-streams $S_1, S_2, \ldots, S_N$ may or may not be encoded subsequently, for example, entropy encoded, in encoders $C_1, C_2, \ldots, C_N$ before transmitting them over a channel a. An encoder produces from the source signal a signal which is compatible with the channel. The channel is the physical medium that conducts the transmitted signal. After transmission over the channel the signals are received at a receiver or decoder side. A receiver or decoder attempts to recreate the message from the received signals. The received signals may be distorted or include deletions (e.g. caused by interference). The at least partially received signals $P_1, P_2, \ldots, P_N$ are inverse quantized or dequantized at the receiver side of the transmission system. The terms "inverse quantizing" and "dequantizing" have the same meaning, and one can be replaced by the other in the present document. The inverse quantization or dequantizing may be done in a separate dequantizer $Q_1^{-1}, Q_2^{-1}, \ldots, Q_N^{-1}$ for each bit-stream or in a single dequantizer for all the streams. Each inverse quantized signal can be used alone for displaying an approximation of the source digital signal, e.g. for displaying an approximation of a source image. Alternatively, at least two inverse quantized signals may be combined into an inverse quantized and combined signal which can be used e.g. for displaying a better approximation of the transmitted image. Alternatively, the inverse quantization or dequantizing may be done in a combined inverse quantizer, also leading to an inverse quantized and combined signal which can be used e.g. for displaying the transmitted image.

Figure 1B:
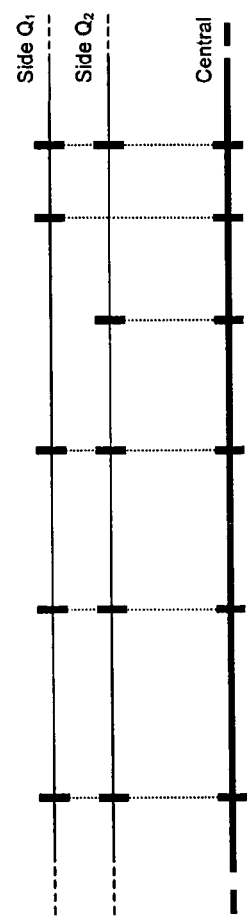
FIG. 1B illustrates an example of multiple description coding using classical fixed-rate scalar quantizers in which the partition-cells of the central quantizer are obtained by intersecting the partition cells of the two side quantizers.

For the two-channel case, the basic principle of multiple description coding using classical fixed-rate scalar quantizers is illustrated in FIG. 1A. At the sender site, the input source is quantized using two different scalar quantizers $Q_1$ and $Q_2$, producing two different description of the input source, which are sent to the client over two different channels. If only one description is received at the client side, depending on the received description, the decoder reconstructs an approximation $S_1$ or $S_2$ of the input source using the inverse quantizers (dequantizers) $Q_1^{-1}$ or $Q_2^{-1}$. If both descriptions are received, the decoder reconstructs a different version $S_C$ of the input source using the inverse quantizer $Q_C^{-1}$. As shown in the example of FIG. 1B, the partition-cells of the central-channel quantizer $Q_C$ are given by intersecting the partition-cells of the side-quantizers $Q_1$ and $Q_2$. Hence, the central-channel reconstruction $S_C$ is better (in distortion sense) than any of the side-channel reconstructions $S_1$ or $S_2$. It is important to remark that multiple-description coding using scalar quantizers illustrated by FIGS. 1A and 1B refers to fixed-rate (single-rate) quantizers. One embodiment of the invention focuses on embedded side and central-channel quantizers, as discussed next.

Figure 2A:
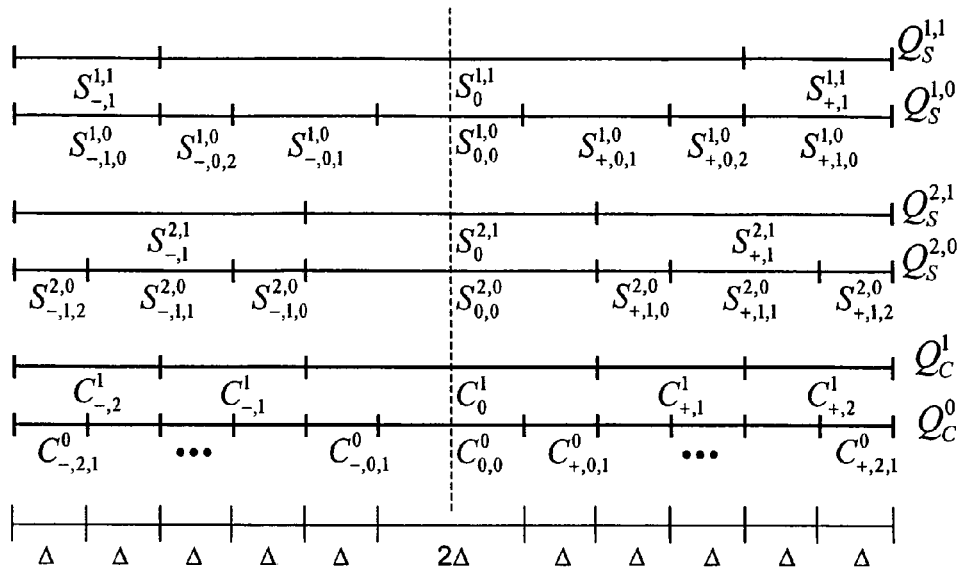
FIG. 2A illustrates two-channel EMDSQ according to an embodiment of the present invention: the side quantizers are $Q_S^{m,P}$, with the number of side quantizers being m=1,2, and there being two quantization levels p=0,1. $Q_C^P(x)$ represents the central quantizer. Neglecting the signs, the side and central quantization intervals are of the form $S_{k_0}^{m,1}$, $S_{k_0,k_1}^{m,0}$ and $C_{k_0}^1$, $C_{k_0,k_1}^0$, respectively.
Figure 2B:
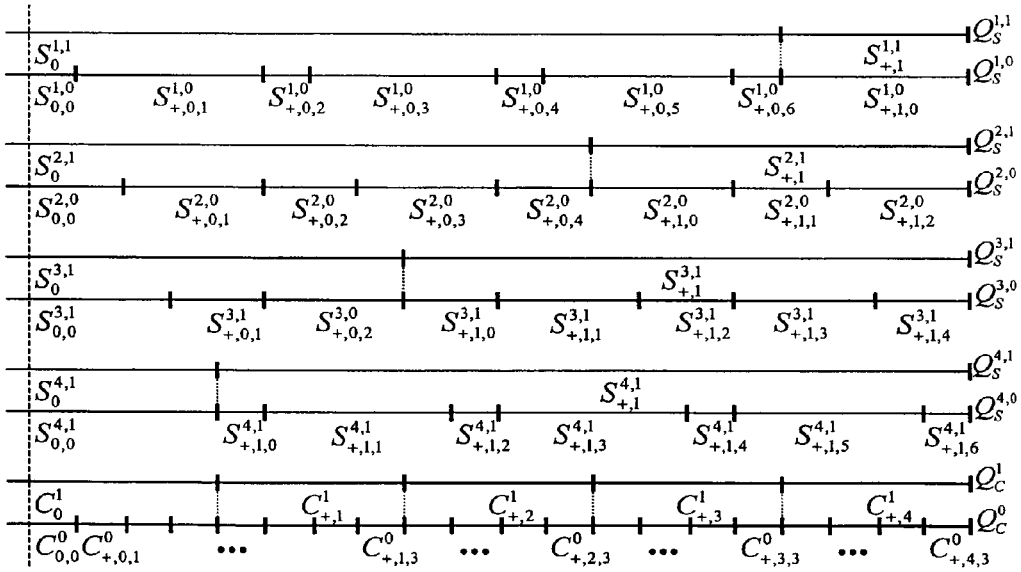
FIG. 2B illustrates four-channel EMDSQ according to an embodiment of the present invention: the side quantizers are $Q_S^{m,P}$, with the number of side quantizer being m=1 . . . 4, and there being two quantization levels p=0,1. The central quantizer is $Q_C^P$.

FIG. 2A and FIG. 2B illustrate examples of embedded quantizers in accordance with one embodiment of the present invention. For the two-channel case, it is noticeable from FIG. 2A that both the side quantizers $Q_S^{1,0}, Q_S^{2,0}$ as well as the central-channel quantizer $Q_C^0$ at level 0 are finer than the corresponding quantizers at level 1, $Q_{S1,1} Q_S^{2,1}$ and $Q_C^1$ respectively. Similarly, for the four-channel case shown in FIG. 2B, the side quantizers $Q_S^{1,0}, Q_S^{2,0}, Q_S^{3,0}, Q_S^{4,0}$ as well as the central-channel quantizer $Q_C^0$ at level 0 are finer than the corresponding quantizers at level 1, $Q_S^{1,1}, Q_S^{2,1}, Q_S^{3,1}, Q_S^{4,1}$ and $Q_C^1$ respectively. This example illustrates that both the side quantizers as well as the central quantizers are embedded, that is, the partition cells at a given quantization level are embedded in the partition cells at all the higher quantization levels.

For the quantizers, EMDSQ, according to an embodiment the side quantizers $Q_S^{m,p}$ are non-uniform embedded quantizers, thus for any $0 \leq p \leq P$ there exist k,j, $k \neq j$ such that $L_k \neq L_j$. The example depicted in FIG. 2A illustrates an instantiation of a two-channel EMDSQ according to one embodiment of the invention. In view of simplification, only two quantization levels p=0,1 are considered. It is noticed for instance that the quantization intervals $s_{-,1}^{2,1}$ and $S_{+,1}^{2,1}$ of the second-channel embedded quantizer $Q_S^{2,1}$ are divided respectively into three quantization intervals $S_{\pm 1,0}^{2,0}, S_{\pm 1,1}^{2,0}$ and $S_{\pm 1,2}^{2,0}$ of the higher rate quantizer $Q_S^{2,0}$. On the contrary, the dead zone $S_0^{2,1}$ of the second-channel embedded quantizer $Q_S^{2,1}$ is not divided and is transformed into $S^{0,2,0}$ of $Q_S^{2,0}$.

A uniform entropy-coded scalar quantizer is optimal for high rates, and nearly optimal for lower rates, as described in D. Taubman and M. W. Marcellin, *JPEG2000—Image Compression: Fundamentals, Standards and Practice*, Hingham, Mass.: Kluwer Academic. Publishers, 2001. Furthermore, the above book also describes that, for input data with symmetric probability density function (PDF), the rate-distortion behaviour at low rates can be improved by widening the quantization interval located around zero, that is, by using deadzone uniform scalar quantizers. The rate-distortion function gives the minimum rate needed to approximate a source signal up to a given distortion. It can be noticed that the central quantizer $Q_C^1$ and $Q_C^0$ obtained from the side quantizers $Q_S^{1,1}, Q_S^{2,1}$ and $Q_S^{1,0}, Q_S^{2,0}$ presented in FIG. 2A is a double-deadzone embedded quantizer, i.e. a quantizer having equal quantization intervals with a size or width $\Delta$, except for the quantization interval around zero which has a size or width $2\Delta$. Hence, it shows the above-mentioned characteristics of improved rate-distortion behaviour.

For two-channel EMDSQ, an analytical expression of an embodiment of a proposed embedded side-quantizer for the first channel is:

$$Q_S^{1,p}(x) = \begin{cases} 0 & x \in [-A_{Inf}^{1,p}, A_{Inf}^{1,p}) \\ Q_A^{1,p}(x) & x \in [-A_{Sup}^{1,p}, -A_{Inf}^{1,p}) \cup [A_{Inf}^{1,p}, A_{Sup}^{1,p}) \\ Q_B^{1,p}(x) & x \in [-B_{Sup}^{1,p}, -B_{Inf}^{1,p}) \cup [B_{Inf}^{1,p}, B_{Sup}^{1,p}) \end{cases} \quad \text{Eq. (1)}$$

where:

$$Q_A^{1,p}(x) = \text{sign}(x)\left(\left\lfloor \frac{|x|}{2^p \Delta} + \frac{\xi}{2^p} \right\rfloor - (k + p\%2)\right) \quad \text{Eq. (2)}$$

$$Q_B^{1,p}(x) = \text{sign}(x)\left(\left\lfloor \frac{|x|}{2 \cdot 2^p \Delta} + \frac{\xi}{2 \cdot 2^p} + \frac{k + (1 - p\%2)}{2} \right\rfloor\right) \quad \text{Eq. (3)}$$

The boundary points in Eq. (1) are defined as follows:
$A_{Sup}^{1,p} = \Delta(2^P(3k+1+2p\ \%2)-\xi)$, $A_{Inf}^{1,p} = \Delta(2^P(3k+2p\ \%2)-\xi)$,
$B_{Sup}^{1,p} = \Delta(2^P(3k+3-p\ \%2)-\xi)$, $B_{Inf}^{1,p} = \Delta(2^P(3k+1-p\%2)-\xi)$.

In the above equations and formulae:
⌊a⌋ denotes the integer part of a,
Δ>0 is the size or width of a quantization interval for $Q_C^0$,
p %2=p−2·⌊p/2⌋, and ξ (with ξ<1) determines the size or width of the deadzone.
[a, b) denotes an interval which is closed in a but open in b, that is if X ∈[a, b) then a≦x≦b
The index k ∈z+ determines the size or width of the quantizer granular region, which is the interval $[y_k-\Delta/2, y_{k-\Delta}/2]$; source samples in this interval will be approximated within ±Δ/2 by their quantized values.

Since the parameter ξ controls the size or width of the central deadzone, the central deadzone being one of the quantizer intervals by definition, by tuning its value, corresponding families of embedded quantizers may be obtained. It should be noted that, when ξ=½, the central quantizer is uniform, while when ξ=0, the deadzone width is 2Δ; this is the case exemplified in FIG. 2A. Negative values of the parameter ξ are further widening the deadzone, as described in the JPEG2000 book mentioned above.

Generalization of the Invention to M Channels EMDSQ

M channel quantizers can only be formulated analytically, since it is not possible to graphically build an M-dimensional matrix to apply Vaishampayan's method.

Taking as a starting point equation Eq. (1) that describes an embodiment of the first channel quantizer corresponding to the two-channel EMDSQ, it is possible to generalise the analytical formula so as to obtain an embodiment for M-channels, as shown below:

$$Q_S^{m,p}(x) = \begin{cases} Q_A^{m,p}(x) & x \in [-A_{Sup}^{m,p}, -A_{Inf}^{m,p}) \cup [A_{Inf}^{m,p}, A_{Sup}^{m,p}) \\ Q_B^{m,p}(x) & x \in [-B_{Sup}^{m,p}, -B_{Inf}^{m,p}) \cup [B_{Inf}^{m,p}, B_{Sup}^{m,p}) \end{cases} \quad \text{Eq. (4)}$$

with:

$$Q_A^{m,p}(x) = \text{sign}(x)\left\lfloor \frac{|x|}{mM^p\Delta} - \frac{M+1-2m}{m}(k + p\%2) \right\rfloor \quad \text{Eq. (5)}$$

$$Q_B^{m,p}(x) = \text{sign}(x)\left\lfloor \frac{|x|}{(M+1-m)M^p\Delta} + \frac{M+1-2m}{M+1-m}(k + 1 - p\%2) \right\rfloor$$

and the boundary points are defined as follows:
$A_{Sup}^{m,p} = \Delta \cdot M^p((M+1)k+m+(M+1-m)(p \%2))$,
$A_{Inf}^{m,p} = \Delta \cdot M^p((M+1)k+(M+1-m)(p \%2))$,
$B_{Sup}^{m,p} = \Delta \cdot M^p((M+1)k+M+1-m(p \%2))$,
$B_{Inf}^{m,p} = \Delta \cdot M^p((M+1)k+m-m(p \%2))$, where m,1≦m≦M denotes the channel index.

It is to be noted that the particular example of Eq. (1) is derived from Eq. (4) for M=2, m=1 and ξ=0.

Based on the expressions for $A_{Sup}^{m,p}$, $B_{Sup}^{m,p}$, $A_{Inf}^{m,p}$, $B_{Inf}^{m,p}$ given above, one notices that the size or width $\Delta^{(p)}$ of a quantization interval for the side quantizer $Q_S^{m,p}$ at level p and index m depends on the number of channels M by $\Delta^{(p)} = M^p \Delta^{(0)}$, where $\Delta^{(0)}$ is the size or width of the quantization interval for the highest-rate side quantizer $Q_S^{m,0}$, and $\Delta^{(0)} = m\Delta$ or $\Delta^{(0)} = (M+1-m)\Delta$.

FIG. 2B depicts the case of four channels (M=4) and two quantization levels (0≦p≦1). It is to be noted that the quantization intervals of the side quantizers $Q_S^{m,0}$, 1≦m≦4 are embedded respectively in the quantization intervals of the side quantizers $Q_S^{m,1}$. It is also to be noted that the central quantizer $Q_C^P$ is a double deadzone embedded quantizer with quantization interval size or width $\Delta_C^{(p)} = 4^p \Delta_C^{(0)}$, where $\Delta_C^{(0)} = \Delta$ is the quantization interval size or width of $Q_C^0$. The negative side of the quantizers is not illustrated, but is a mirrored version of the positive side which is shown.

Dependency Between Redundancy and the Number of Channels

All approaches that imply MDC involve creating redundancy in the bit-stream transmitted over several channels. By $R_m$, 1≦m≦M the rates are denoted, and by $D_m(R_m)$ the corresponding side average distortions over M channels. The average distortion of the central quantizer shall be $D_0$. The standard source coder, i.e. the single-description coder (SDC), a coder that implies one source coder and one decoder contrary to MDC which implies multiple source encoders and multiple source decoders, minimises $D_0$ for a given rate $R_0$. Intuitively, the redundancy is the bit-rate sacrificed compared to the SDC coder in order to lower the $D_m$ distortion. A redundancy function is considered:

$$\rho = \sum_{m=1}^{M} R_m - R_0 \quad \text{Eq. (6)}$$

where $R_0$, is the lowest rate needed by any SDC in order to achieve the central $D_0$ distortion of the MDC. For a fixed $D_0$, the redundancy ranges from $(M-1)R_0$ (the bit-stream is replicated over the M channels) to 0 (the data is totally uncorrelated over the M channels).

For the lowest-rate case (see example of FIG. 2B), the number of central quantizer quantization intervals is 2(M+1)−1. Hence, the central quantization rate is $R_0 = \log_2(2(M+1)-1)$. Since the number of quantization intervals for all lowest-rate EMDSQ side-quantizers is three, their individual rate is $R_m = \log_2 3$. Thus, formula Eq. (6) for the lowest rate quantizers can be written $\rho_p = M\log_2 3 - \log_2(2M+1)$. Similarly, for level p=P−1, the number of quantization intervals of the side quantizers $Q_S^{m,P-1}$ is 4M−1, which yields a rate of $R_m = \log_2(4M-1)$. The central quantization rate will be $R_0 = \log_2 2M(M+1)-1$. Following the same reasoning, for quantization level p, $R_m = \log_2(4M^{P-p}-1)$ and $R_0 = \log_2(2M^{P-p}(M+1)-1)$ are obtained. Consequently, the redundancy for quantization level p can be expressed as follows:

$$\rho_p = M\log_2(4M^{P-p}-1) - \log_2(2M^{P-p}(M+1)-1) \quad \text{Eq. (7)}$$

From Eq. (7), one can deduce the analytical expression of the normalised redundancy:

$$\rho'_p = \frac{M \log_2(4M^{P-p} - 1)}{\log_2(2M^{P-p}(M + 1) - 1)} - 1 \quad \text{Eq. (8)}$$

One can conclude that for the EMDSQ the redundancy is directly dependent on the number of channels. Whereas, in the case of two channels, one can trigger the redundancy level by the number of diagonals filled in the index assignment matrix as described in V. A. Vaishampayan, "Design of multiple description scalar quantizers," *IEEE Trans. Inform. Th.*, vol. 39, no. 3, pp. 821-834, 1993.

Figure 3:
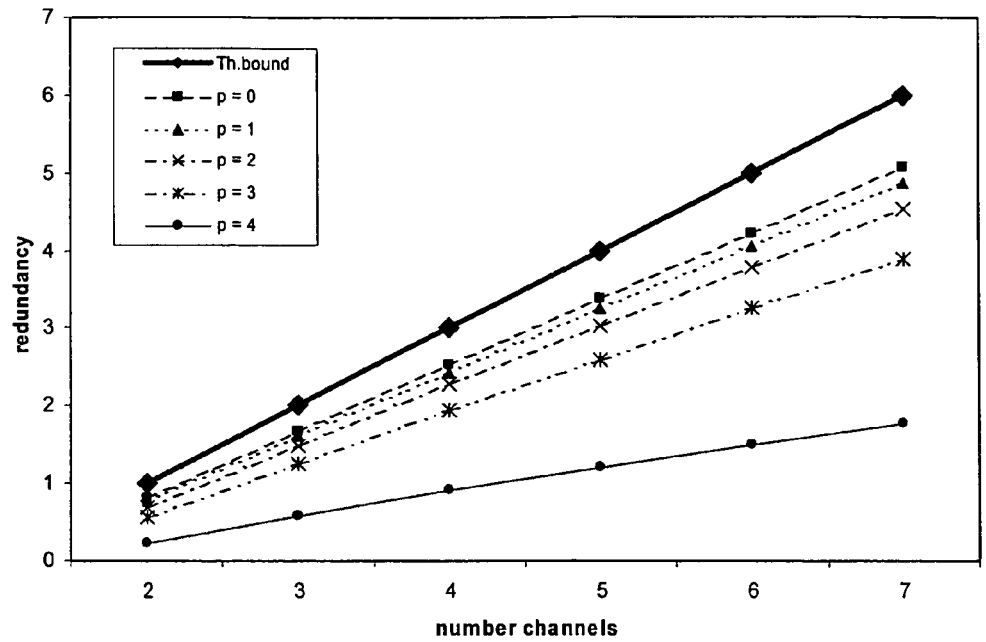
FIG. 3 is an illustration of redundancy ρ versus number of channels for 2≦M≦7 in function of a quantization level p, where the total number of quantization levels is P=5, and 0≦p≦5.

A graphic representation of the redundancy versus the number of channels, given by Eq. (8), is shown in FIG. 3. The theoretical boundary of the redundancy $(M-1)R_0$ is reached when the stream is replicated over M channels and is represented by the upper curve in the graph. It is noticeable that the redundancy between the channels monotonically decreases as the quantization level p increases.

Coding Scheme

The use of the EMDSQ according to one embodiment of the invention into a wavelet-based coding scheme is illustrated, for the particular case of the number of channels being M=2. A proposed MD-QT coding system encodes the quantizers' output by using a customised version of the wavelet-based QT coding of the significance maps algorithm described in A. Munteanu, J. Cornelis, G. Van der Auwera, and P. Cristea, "Wavelet-based lossless compression scheme with progressive transmission capability," *Int. J. Imaging Systems and Tech.*, vol. 10, no. 1, pp. 76-85, January 1999. This is only one example of one particular coding algorithm that can used EMDSQ. Any type of coding algorithm, and any type of input source such as for example special domain, wavelet transform or DCT transform, can be used.

Significance Map Coding

By $T^p$ is denoted the significance threshold from a coding step corresponding to the quantization level p, $0 \leq p \leq P$; the significance of wavelet coefficients being recorded in a significance map with respect to the applied threshold $T^p$. By $k=(k_1,k_2)$ the spatial location of the wavelet coefficient from the wavelet transform matrix is denoted, where $k_1$ and $k_2$ stand for the row and column index, respectively. By Q(k, v) a quadrant with top-left co-ordinates $k=(k_1, k_2)$ and size or width $v=(v_1, v_2)$ is denoted, where $v_1$ and $v_2$ represent the quadrant width and height respectively. In view of simplification identical power-of-two quadrant dimensions $v_1$ and $v_2$ are assumed, i.e. $v_1=v_2=2^J$ for some J. The corresponding quadrant delimiting binary elements in the significance map p is denoted by $Q_b^p(k,v)$. The wavelet image $w=Q(0,V)$ is a matrix of $v_1 \times v_2$ elements, with $0=(0,0), v=(v_1,v_2)$. For any wavelet coefficient, its absolute value and sign are denoted as w(1) and s(1) respectively, where $1=(l_1,l_2)$ with $0 \leq l_1 \leq v_1$ and $0 \leq l_2 \leq v_2$.

The significance of the wavelet coefficients from any Q(k, v) ∈W, v±(1,1) with respect to the applied threshold $T^P$ is recorded in $Q_b^p(k, v)$ and is determined via the operator $\sigma^p$:

$$\sigma^p(Q(k,v))|_{v \neq (1,1)} = \begin{cases} 1 & \text{if } \exists\, w(l) \in Q(k,v),\, w(l) \geq T^p \\ 0 & \text{if } \forall\, w(l) \in Q(k,v),\, w(l) < T^p \end{cases} \quad \text{Eq. (9)}$$

It is to be noted that the significance operator $\sigma^p$ determines the significance of a quadrant but not the significance of a coefficient. For an individual wavelet coefficient the significant operator $\sigma^p$ is no longer applied, and instead, the quantizer index allocation operator, denoted by $\delta(w(1))$, is utilised.

The EMDSQ by their structure present the particularity that different quantization intervals at quantization level p are divided into different numbers of quantization intervals at the quantization level p-1 as shown hereinabove. Thus, it can be deduced that in order to perform the index allocation, the wavelet coefficients have to be compared against the values of the boundary points of quantization intervals at a certain quantization level p. It is considered that an arbitrary quantization interval at level p will be divided into N quantization intervals at level p-1. The index allocation operator a determines the codeword associated to each quantized coefficient as follows:

$$\delta(w(l)) = \begin{cases} S_N & \text{if } T_{\delta,N-1} \leq w(l) < T_{\delta,N} \\ \ldots \\ S_2 & \text{if } T_{\delta,1} \leq w(l) < T_{\delta,2} \\ S_1 & \text{if } T_{\delta,0} \leq w(l) < T_{\delta,1} \end{cases} \quad \text{Eq. (10)}$$

where the boundary points are denoted as $T_{\delta,n}$, with $0 \leq n \leq N$ and $T_{\delta,0} < T_{\delta,1} < \ldots < T_{\delta,N}$. The manner in which the threshold $T^p$ and boundary points $T_{\delta,n}$ are computed will be described below.

For the first quadtree-partitioning pass, as described in A. Munteanu, J. Cornelis, G. Van der Auwera, and P. Cristea, "Wavelet-based lossless compression scheme with progressive transmission capability," *Int. J. Imaging Systems and Tech.*, vol. 10, no. 1, pp. 76-85, January 1999, the significance of the wavelet image w is tested with respect to the threshold $T^p$. If $\sigma^p(W)=1$, the significance map $Q_b^p(0, v)$ of the wavelet image w is split into four quadrants $Q_b^p(k_i, V/2)$, $1 \leq i \leq 4$, each having half the original parent size or width, with $k_i$ indicating the origin of each quadrant. The descendent significant quadrants are then further spliced until the leaf nodes (i.e. wavelet coefficients) are isolated. For the leaf nodes, the symbols $s_n$ ($0<n \leq N$) are allocated by applying the index allocation operator $\delta(w(1))$. Thus, the significance pass records the positions 1 of all the leaf nodes newly identified as significant, using a recursive tree structure of quadrants (or a quad-tree structure).

Once the positions and the corresponding symbols of the significant leaf nodes are encoded during the significance pass, p is set to P-1. Next, the significance pass is restarted to update the entire quad-tree structure by identifying the new significant leaf nodes. During this stage, only the significance of the previously non-significant nodes and quadrants, i.e. those for which $\delta(w(1))=S_1$ and $\sigma^{p+1}(Q(k,v))=0$ respectively, is encoded, and the significant ones are ignored since the decoder has already received this information. Subsequently, the corresponding refinement pass is activated for the significant leaf nodes. The refinement pass is performed with respect to the corresponding refinement threshold $T_r^{p,m}$. The described procedure is repeated, until the complete wavelet image is encoded, i.e. p=0, or until the target bit-rate is met.

Coding Algorithm

The manner in which the significance thresholds, refinement thresholds and boundary points are computed, is illustrated, for the particular case of the number of channels being M=2.

As explained before, the coding passes performed by the proposed MD-QT coding system are the significance pass, employing the significance thresholds $T^{p,m}$, $0 \leq p \leq P$, followed by the refinement pass, utilising the refinement thresholds $T_r^{p,m}$, with $m1 \leq m \leq 2$ denoting the channel index for the case with two channels.

For the lowest quantization rate P, the starting thresholds corresponding to each channel are $T^{P,1}=2T$ and $T^{P,2}=T$ respectively. Since it is not desirable that the quantizer is characterised by an overload region, or an unbounded interval, the T value is related to the highest absolute magnitude $w_{max}$ of the wavelet coefficients as:

$$T = \lfloor \log_2(w_{max}/3) \rfloor + 1 \quad \text{Eq. (11)}$$

Hence, the maximum number of quantization levels is $P=\lfloor \log_2(w_{max}/3) \rfloor+1$. In general, excepting the lowest quantization rate P, the significance thresholds used for each channel m, $1 \leq m \leq 2$ are given by:

$$T^{P-x,m} = \frac{T_m}{4\lfloor (x+1+(m+1)\%2)/2 \rfloor} 3^{((x+m-1)\%2)} \quad \text{Eq. (12)}$$

with P−x=p, and x≤1. The values $T_m$ are of the form $T_1=2T$ and $T_2=4T$ respectively.

Figure 4:
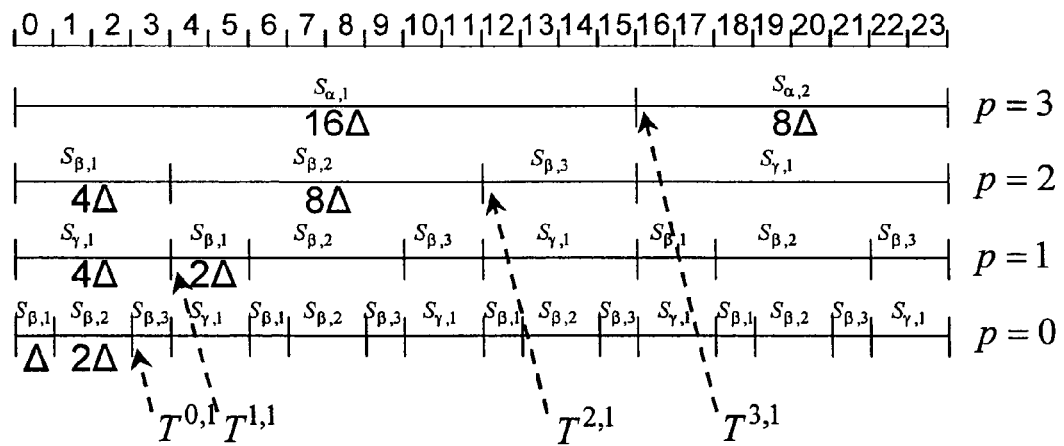
FIG. 4 is a four-level representation of a first side quantizer $Q_S^{1,p}$ for two-channel EMDSQ for an example with granular region ranging from 0 to 23.

FIG. 4 depicts the first channel EMDSQ with granular region ranging from 0 to 24 (x∈[0,24]). The significance map coding is performed with respect to the set of thresholds $T^{p,1}$ with the rate of decay given by Eq. (12). For the two-channel EMDSQ case, except for the highest quantization rate P, the description of the quantizers reveals that half of the quantization intervals at level p are divided into three quantization intervals at level p−1, while the other half are not divided. Thus, three index allocation operators are considered. In the case p=P, the index allocation operator α(w(1)) is used to assign for the leaf-nodes in the quadtree the symbols $S_{\alpha,1}$ and $s_{\alpha,2}$ as follows:

$$\alpha(w(l)) = \begin{cases} S_{\alpha,2} & T_{\alpha,1}^{P,m} \leq w(l) < T_{\alpha,2}^{P,m} \\ S_{\alpha,1} & 0 \leq w(l) < T_{\alpha,1}^{P,m} \end{cases} \quad \text{Eq. (13)}$$

where $T_{\alpha,1}^{P,m=T P,m}$ and $T_{\alpha,2}^{P,m}=3T$.

In the case p<P two operators β(w(1)) and γ(w(1)) are considered, one for each of the two quantization interval types. For the quantization intervals that are divided in three, the index allocation operator β(w(1)) is expressed as:

$$\beta(w(l)) = \begin{cases} S_{\beta,3} & T_{\beta,2}^{p,m} \leq w(l) < T_{\beta,3}^{p,m} \\ S_{\beta,2} & T_{\beta,1}^{p,m} \leq w(l) < T_{\beta,2}^{p,m} \\ S_{\beta,1} & T_{\beta,0}^{p,m} \leq w(l) < T_{\beta,1}^{p,m} \end{cases} \quad \text{Eq. (14)}$$

where the relations between the corresponding quantization interval boundary points are $T_{\beta,1}^{p,m}=T_{\beta,0}^{p,m}+\Delta_C^{(P)}$, $T_{\beta,2}^{p,m}=T_{\beta,0}^{p,m}+3\cdot\Delta_C^{(p)}$ and $T_{\beta,3}^{p,m}=T_{\beta,0}^{p,m}+4\cdot\Delta_C^{(p)}$, where $T_{\beta,0}^{P-x,m}=((x+m)\%2)2\Delta_C^{(P-x)}$, x≥1.

Apart from this, for the remaining half of the quantization intervals that are not divided only one symbol $S_{\gamma,1}$ is assigned through the index allocation operator γ(w(1)) as follows:

$$\gamma(w(1))=S_{\gamma,1} \text{ for } T_{\gamma,0}^{p,m} \leq w(1) < T_{\gamma,1}^{p,m} \quad \text{Eq. (15)}$$

The relation between the corresponding quantization interval boundary points is $T_{\gamma,1}^{p,m}=T_{\gamma,0}^{p,m}+2\Delta_C^{(p)}$, where $T_{\gamma,0}^{P-x,m}=((x+m+1)\%2)4\Delta_C^{(P-x)}$ The purpose of the refinement pass is to perform the index allocation for coefficients that have already been coded as significant at the previous significance passes. The index allocation is performed with respect to the new updated values of the boundary points. In order to apply the index allocation, the coefficient that must be refined has to be rescaled with respect to the refinement pass threshold $T_r^{p,m}$ given by: $T_r^{p,m}=\max(T_{\gamma,1}^{p,m}, T_{\beta,3}^{p,m})$.

In order to improve the compression results, the output of the MD-QT coder (significance symbols, quantizer index symbols, signs symbols) may further be entropy coded with an adaptive arithmetic coder, as described in I. H. Witten, R. M. Neal, and J. G. Cleary, "Arithmetic coding for data compression," Communications of the ACM, vol. 30, no. 5, pp. 520-540, June 1987, that uses four different probability models. One model is used to encode the quadrant significance symbols. Another model is used for the sign symbol encoding. Finally, another two models are utilised to entropy code the symbols generated by the index allocation operators α(w(1)) and β(w(1)) respectively. Since the MD-QT output for the quantization intervals that are not divided is represented by only one symbol $s_{\gamma,1}$, it is completely redundant to further encode these symbols.

EXPERIMENTAL RESULTS

Figure 5:
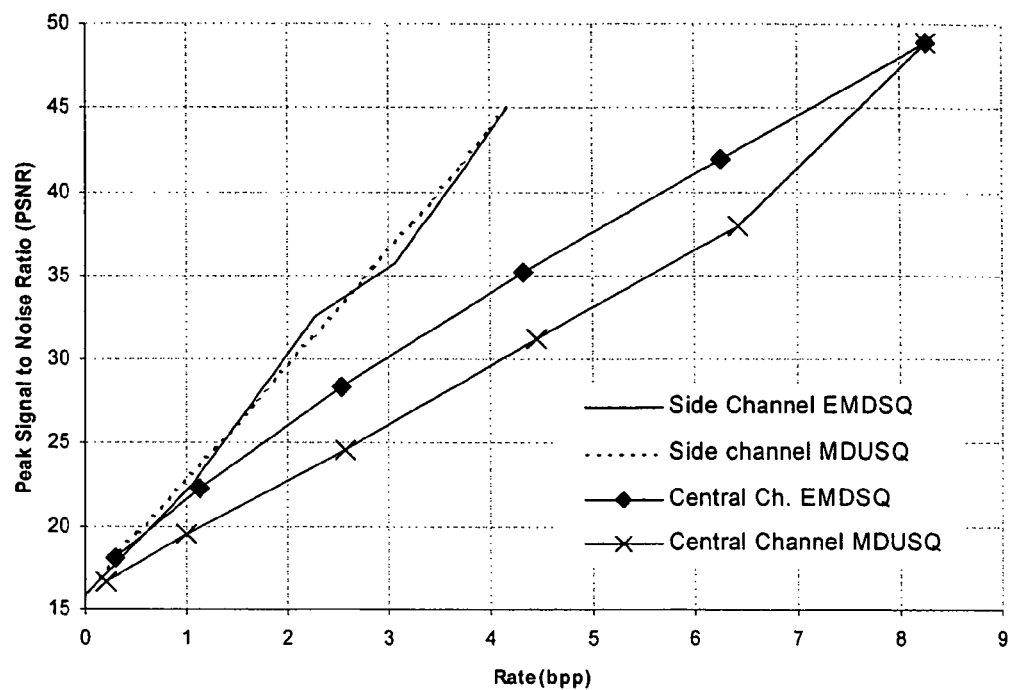
FIG. 5 illustrates a comparison of side and central rate-distortion performance between EMDSQ and MDUSQ.

To perform a comparison between the EMDSQ according to one embodiment of the invention and MDUSQ as described in Guionnet et al., both quantizers are applied on a memoryless Laplacian source of a 256×256 matrix of Laplacian random generated numbers with zero mean and σ=14.6, simulating a wavelet subband. FIG. 5 shows that comparable results are obtained for the side channel(s) and that in one embodiment the EMDSQ outperforms MDUSQ for the central channel. Similar experimental results were obtained varying the standard deviation within the range 12<σ<90.

Figure 6:
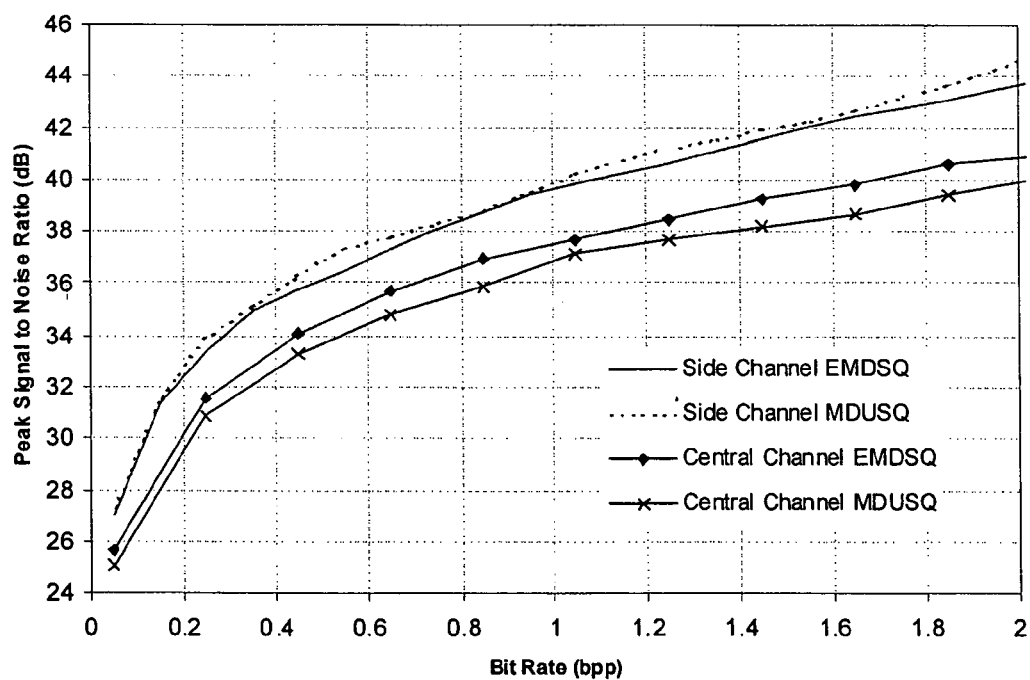
FIG. 6 illustrates a comparison of side and central rate-distortion performance obtained on a "Lena" image with a resolution of 512×512 pixels with an MD-QT code employing EMDSQ according to an embodiment of the present invention and MDUSQ according to the prior art respectively.

Similar to EMDSQ, the MDUSQ has been integrated in the MD-QT coding scheme, resulting into a common entropy-coding module for both types of quantizers. The results shown in FIG. 6 obtained on the Lena image reveal that on the central channel the EMDSQ outperforms MDUSQ with 0.52-1.08 dB. Similarly, the results obtained on a common image data set given in the Table of FIG. 7 show that in comparison to the prior art MDUSQ, the EMDSQ according to one embodiment of the invention provides constantly better rate-distortion performances on the central channel for all the rates. In one embodiment, the quantizers can provide under certain circumstances at least 1% improvement of the dB of peak signal to noise ratio of data processed in accordance with embodiments of the invention.

Controlling Redundancy

In order to reduce bandwidth it would be preferable to reduce any redundancy in transmitted signals. In accordance with an aspect of the present invention the level of redundancy can be adapted depending upon the channel. The embedded bitstreams made by such quantizers are preferably progressively refinable. In accordance with an aspect of the present invention, the redundancy in information is controlled between descriptions on a level-by-level basis, for example at each level. Thus, one aspect of the invention provides an embedded quantizer having means for controlling the amount of redundancy between different descriptions at least one quantization level.

The embedded multiple description scalar quantizers proposed above according to the other embodiments of the present invention are quantizers with connected partitions cells that target a high redundancy level and provide good coding results. In an EMDSQ in accordance with further embodiments of the present invention such quantizers can be successfully employed for the coarser quantization levels for an increased resilience of the multiple descriptions. On the other hand quantizers with disconnected partition cells can be employed in order to reduce the descriptions' redundancy. Hence, for the less important layers (corresponding to the finer quantization levels), embedded side quantizers with disconnected partition cells producing double-deadzone central quantizers can be designed. One aspect of the present invention is the solution to this problem and the mixture between these two classes of quantizers, yielding an EMDSQ family.

For the two-channel EMDSQ, the set of embedded side-quantizers are denoted as $Q_S^{m,0}, \ldots, Q_S^{m,K}, Q_S^{m,K+1}, \ldots, Q_S^{m,K+P+1}$, with m=1,2, where the quantization level q, $K+1 \leq q \leq K+P+1$, corresponds to the low-rate quantizers with connected partitions cells, while q, $0 \leq q \leq K$ corresponds to the higher-rate quantizers with disconnected partitions cells. In these notations P+1 and K+1 denote the number of quantization levels for the embedded quantizers with connected and disconnected partition cells respectively. Also, $Q_C^0, \ldots, Q_C^K, Q_C^{K+1}, \ldots, Q_C^{K+P+1}$ denote the set of embedded central-quantizers $Q_C^{q-1}(q_k^1, q_k^2) = Q_S^{1,q-1}(q_k^1) \cap Q_S^{2,q-1}(q_k^2)$ for any quantization level q, $0 \leq q \leq K+P+1$.

From the analytical expression of the embedded multiple-description scalar quantizers with connected partitions cells described above one can derive the following index allocation matrix:

$$I(r) = \begin{bmatrix} 1 & 2 & & & & 0 \\ & 3 & & & & \\ & & 4 & 5 & & \\ & & & 6 & & \\ & & & & \ddots & \\ 0 & & & & 3N-2 & 3N-1 \\ & & & & & 3N \end{bmatrix} \quad \text{Eq. 16}$$

where $1 \leq r \leq 3N$, 3N represents the number of partition cells contained in the granular region of the central quantizer at the quantization level q=K+1, and $P = \lfloor \log_2 N \rfloor$.

Figure 10:
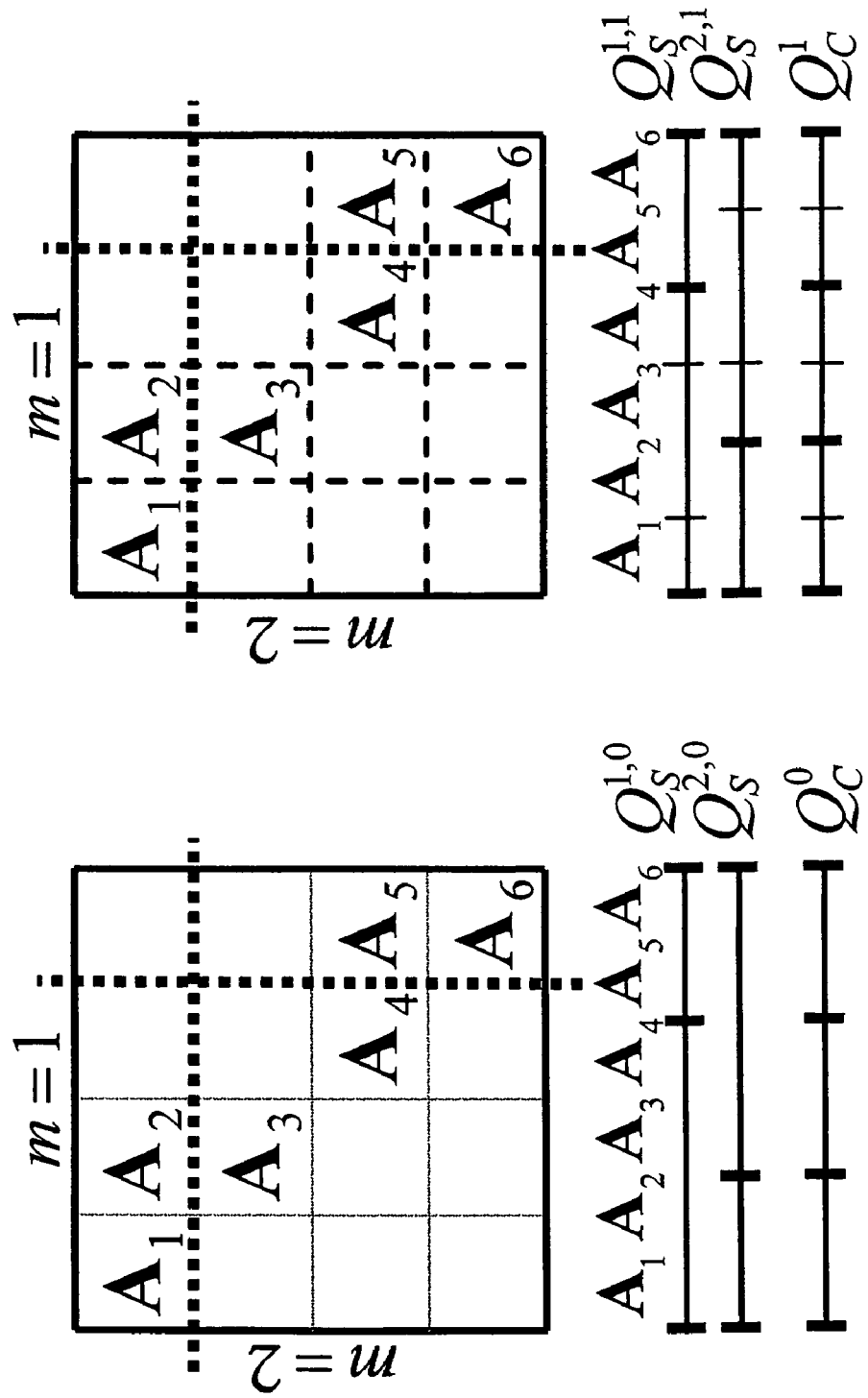
FIG. 10 illustrates an EMDSQ with connected partitions cells and the corresponding embedded index assignment strategy for two quantization levels (p=1).

In the EMDSQ according to the present embodiment, the integer entries in the index allocation matrix I(r) of Eq. 16 are replaced by S×S square matrices of consecutive indices $A_r = (a_{ij})_{1 \leq i,j \leq S}$ (see FIG. 10). In this generic case, the index allocation matrix is given by:

$$I(A_r) = \begin{bmatrix} A_1 & A_2 & & & & 0 \\ & A_3 & & & & \\ & & A_4 & A_5 & & \\ & & & A_6 & & \\ & & & & \ddots & \\ 0 & & & & A_{3N-2} & A_{3N-1} \\ & & & & & A_{3N} \end{bmatrix} \quad \text{Eq. 17}$$

For any matrix M we define the operator nnz(M) that determines the number of nonzero elements contained in the matrix M. From Eq. 17 it follows that for the central quantizers at level q=K+1 the sizes of the bounded partitions cells are of the form $\text{nnz}(A_r) \cdot \Delta_C$, where $\Delta_C \Delta \Box_+^*$ is the central-channel's step size at the highest rate. Imposing the design constraint of obtaining a double-deadzone central quantizer for the level q=K+1 implies equal size for all bounded partition-cells. This necessarily implies an equal number of nonzero elements for all the index matrices $A_r$, i.e. $\text{nnz}(A_r) = \text{const.}, \forall r, 1 \leq r \leq 3N$. Therefore, the cell size for the central quantizer at level q=K+1 is $\Delta_C^{(K+1)} = \text{nnz}(A_r)\Delta_C$.

From the above and the EMDSQ cell size formulas (Eq. 1-3 above) it can be deduced that the central channel quantizer is a double-deadzone embedded quantizer with the cell size of the form:

$$\Delta_C^{(q)} = 2^{q-K-1}\text{nnz}(A_r)\Delta_C \quad \text{Eq. 18}$$

for any level q, $K+1 \leq q \leq K+P+1$. Consequently, from the above, one can deduce that the cell size for the side channels is of the form $\Delta^{(q)} = 2^{q-K-1}\Delta^{(K+1)}$ where $\Delta^{(K+1)} = \text{nnz}(A_r)\Delta_C$ or $\Delta^{(K+1)} = 2 \cdot \text{nnz}(A_r)\Delta_C$.

The example depicted in FIG. 10 illustrates an embodiment of the EMDSQ with connected partitions cells for two quantization levels and the corresponding embedded index assignment strategy. The negative side of the quantizers is a mirrored version of the positive side shown in FIG. 10. If $\text{nnz}(A_r)$ is constant, then $Q_C^0$ and $Q_C^1$ are double-deadzone scalar quantizers.

Starting with the quantization level q=K, quantizers with disconnected partition cells are employed in order to reduce the redundancy between the two descriptions. This corresponds to a reduced error-robustness for the finer quantization levels; however, this reduces the rate in comparison to the rate that would be obtained with quantizers with connected partition cells.

At the level q=K we consider each of the s×s square matrices $A_r$, as block matrices of the form $A_r = [B_{ij}^K]_{1 \leq i,j \leq L_K}$ defined by the contained blocks $B_{ij}^K$, $1 \leq i,j \leq L_K$ and represented as follow:

$$A_r = \begin{bmatrix} B_{11}^K & B_{12}^K & \cdots & B_{1L_K}^K \\ \vdots & \vdots & & \vdots \\ B_{L_K 1}^K & B_{L_K 2}^K & \cdots & B_{L_K L_K} \end{bmatrix} \quad \text{Eq. 18}$$

Figure 11:
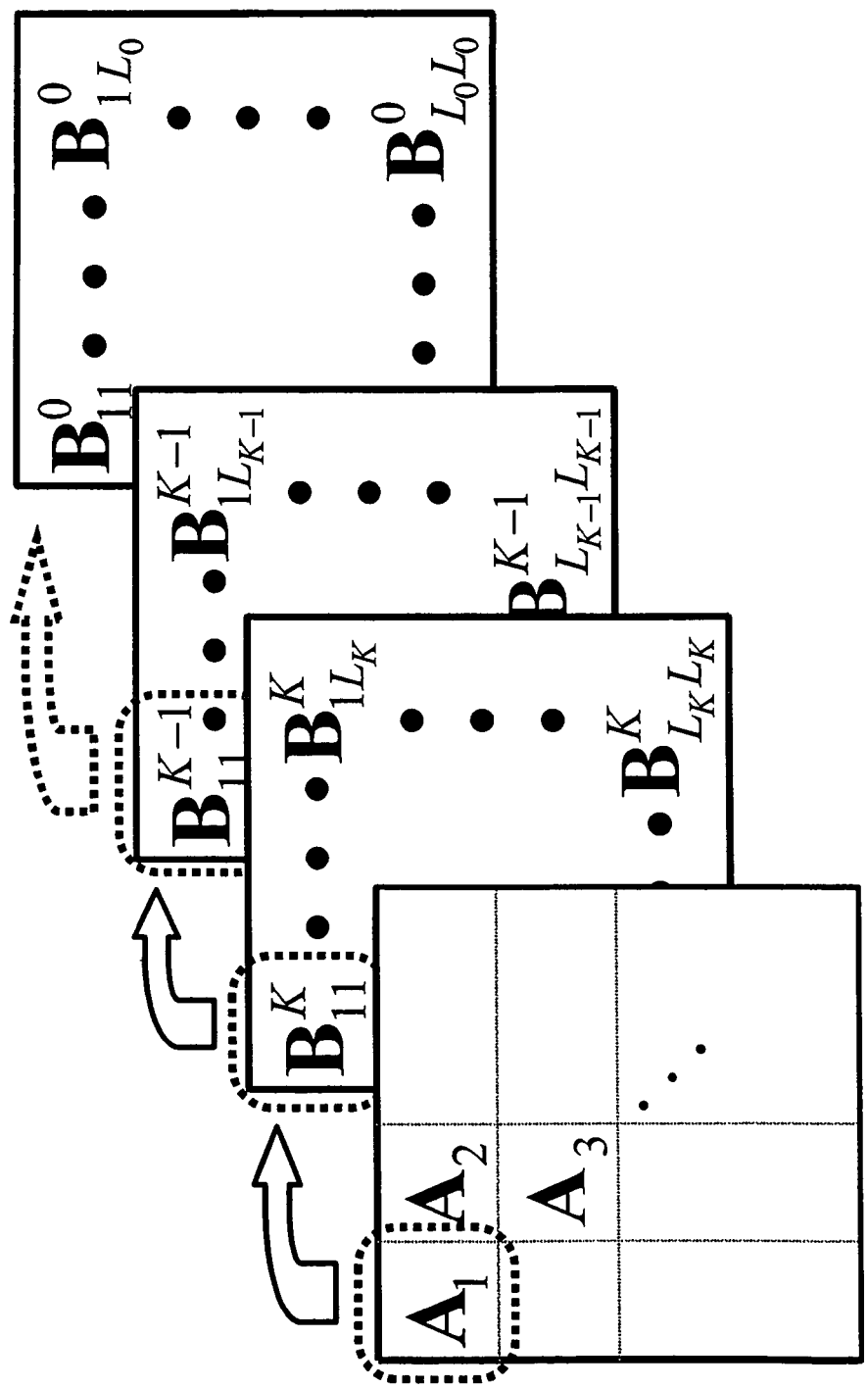
FIG. 11 illustrates recursive block-matrix decomposition for each quantization level q,0≦q≦K.

Moreover, each of the blocks $B_{ij}^K$ is square matrices of the same size $S_K = S/L_K$. Similarly, at the finer quantization level q=K−1, each block matrix $B_{ij}^K$ is again of the form: $B_{ij}^K = [B_{mn}^{K-1}]_{1 \leq m,n \leq L_{K-1}}$ for any $1 \leq i,j \leq L_K$, and the contained blocks $B_{mn}^{K-1}$ are of the size $S_{K-1} = S/(L_K \cdot L_{K-1})$ Recursively, $B_{ij}^q = [B_{mn}^{q-1}]_{1 \leq m,n \leq L_{q-1}}$ for any $1 \leq i,j \leq L_q$, and for all the quantization levels q, $0 \leq q \leq K$ (see FIG. 11).

From $\text{nnz}(A_1) = \text{nnz}(A_2) = \ldots = \text{nnz}(A_{3N}) = \text{const.}$ and imposing the design constraint that for any quantization level one obtains a double-deadzone central quantizer, yields: $\text{nnz}(B_{ij}^q) = \text{nnz}(B_{mn}^q)$, $\forall i,j,m,n$ $1 \leq i,j,m,n \leq L_q$ for any $[B_{ij}^q] \neq [0]$ and $[B_{mn}^q] \neq [0]$, where by [0] one denotes the zero matrix.

Following the recursive decomposition of each block matrix $B_{ij}^{q+1}$, $1 \leq i,j \leq L_{q+}$, one obtains $L_q^2$ square blocks of size:

$$S_q = \frac{S}{\prod_{k=q}^{K} L_k} \quad \text{Eq. 19}$$

Notice that for the highest-rate quantization level q=0 all blocks $B_{ij}^0$ $1 \leq i, j \leq L_0$ are matrices of dimension $S_0 = 1$, i.e. they contain a single element.

One obtains the cell size at any level q, $1 \leq q \leq K$ of the double-deadzone central quantizer by:

$$\Delta_C^{(q)} = \text{nnz}(B_{ij}^q)\Delta_C \quad \text{Eq. 20}$$

for any $1 \leq i,j \leq L_q$ and $[B_{ij}^q] \neq [0]$.

Consider a block matrix $M = [M_{ij}]_{1 \leq i \leq I, 1 \leq j \leq J}$. The number of blocks $[M_{ij}] = [0]$ contained in M is determined via the nonzero-blocks operator $\text{nzb}(M,M_{ij})$. The operator $\text{nzb}(M,M_{ij})$ is similar to the operator nnz(M) in the case of unitary size blocks $M_{ij}$. With this definition, for any of the block matrices $B_{ij}^q = [B_{mn}^{q-1}]_{1 \leq m,n \leq L_{q-1}}$, the number of blocks $B_{mn}^{q-1}$ different from the zero matrix is given by $N_{q-1} = \text{nzb}(B_{ij}^q, B_{mn}^{q-1})$.

Also, we denote by $N_K = nzb(A_r, B_{ij}^K)$ where $1 \leq i,j \leq L_K$.

The total number of indices mapped in each $B_{ij}^q$ block matrix at quantization level q is $nnz(B_{ij}^q) = \Pi_{k=0}^{q-1}$, for any r, $1 \leq r \leq 3N$ and $1 \leq i,j \leq L_q$. Moreover, $nnz(A_r) = \Pi_{q=0}^K N_q$. Therefore, the total number of indices mapped in the index assignment matrix $I(A_r)$ is $N_r = 3 \cdot 2^{P \cdot \Pi}{}_{q=0}^K N_q$.

It can then be shown that the analytical expression of central EMDSQ for any quantization level q, $0 \leq q \leq K+P+1$ is:

$$Q_C(x) = \text{sign}(x) \left[ \frac{|x|}{\Delta_C \cdot 2^{l(q)H(l(q))} \cdot \prod_{k=0}^{q-1(q)H(l(q))} N_k} \right] \quad \text{Eq. 21}$$

Eq. 21 where the level function $l(q) = q - K - 1$, $H(x)$ denotes the Heaviside unitary step function and $\text{sign}(x) = 2H(x) - 1$.

Denote by $R_m$ the rates and by $D_m(R_m)$ the corresponding side description distortion, where m=1,2. Also, denote by $D_0$ the central distortion. The standard source coder, i.e. the single-description coder (SDC) minimizes $D_0$ for a given rate $R_0$. Intuitively, the redundancy is the bit-rate sacrificed by an MDC compared to the SDC in order to achieve the same central $D_0$ distortion:

$$\rho = \Sigma_{m=1}^2 R_m - R_0 \quad \text{Eq. 22}$$

One derives the redundancy expression for the quantization levels q, $K+1 \leq q \leq K+P+1$ and the SDC rate $R_0 = \log_2(2 \cdot 2^{K+P+2-q} - 1)$ and the corresponding side-channel rate is $R_m = \log_2(2 \cdot 2^{K+P+2-q} - 1)$. Thus, formula 22 for $K+1 \leq q \leq K+P+1$ is given by:

$$\rho_q = 2\log_2(2 \cdot 2^{K+P+2-q} - 1) - \log_2(3 \cdot 2^{K+P+2-q} - 1) \quad \text{Eq. 23}$$

For the quantization levels q, $0 \leq q \leq K$ employing quantizers with disconnected partitions cells, the SDC rate is $R_0 = \log_2(3 \cdot 2^{P+1} \cdot \Pi_{k=q}^K N_k - 1)$ and the corresponding side-channel rate is of the form $R_m = \log_2(2 \cdot 2^{P+1} \Pi_{k=q}^K L_k - 1)$. Thus, formula 22 for $0 \leq q \leq K$ is:

$$\rho_q = 2\log_2(2 \cdot 2^{P+1} \Pi_{k=q}^K L_k - 1) - \log_2(3 \cdot 2^{P+1} \Pi_{k=q}^K N_k - 1) \quad \text{Eq. 24}$$

From Eq. 10 one can deduce the analytical expression of the normalized redundancy:

$$\rho_q = \frac{2 \cdot \log_2 \left( 2 \cdot 2^{P+1} \prod_{k=q}^K L_k - 1 \right)}{\log_2 \left( 3 \cdot 2^{P+1} \prod_{k=q}^K N_k - 1 \right)} - 1 \quad \text{Eq. 25}$$

One can conclude that for any embodiment of the present invention which is an instantiation of the generic EMDSQ family, the redundancy is directly dependent on the quantization level. In addition, for all the quantization levels $q, 0 \leq q \leq K$, the redundancy can be controlled via the $L_q$ and $N_q$ parameters, with $N_q \leq L_q^2$.

Figure 12:
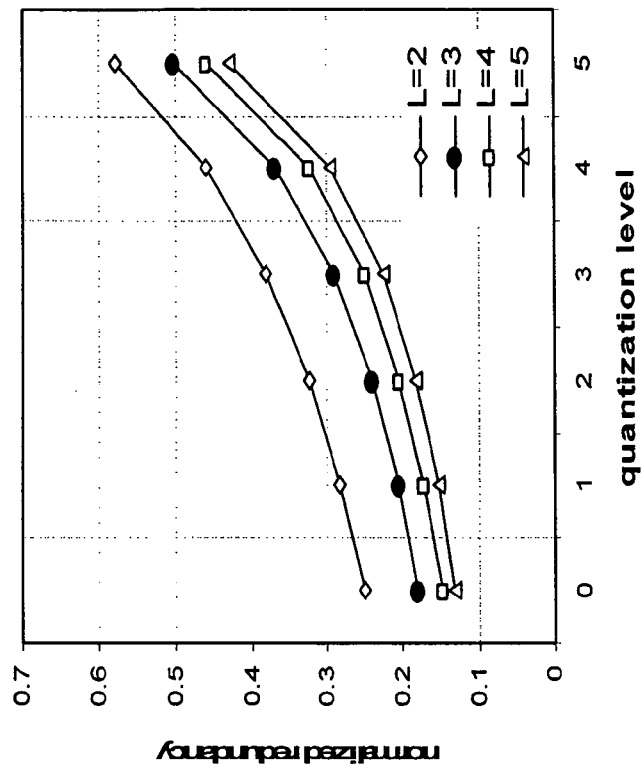
FIG. 12 illustrates redundancy ρ versus quantization level q, 0≦q≦5 for (a) $L_q=3$, $L_q^2-3≦N_q≦L_q^2$; (b) $2≦L_q<5$, $N^q=L_q^2$ in accordance with an embodiment of the present invention.
Figure 12:
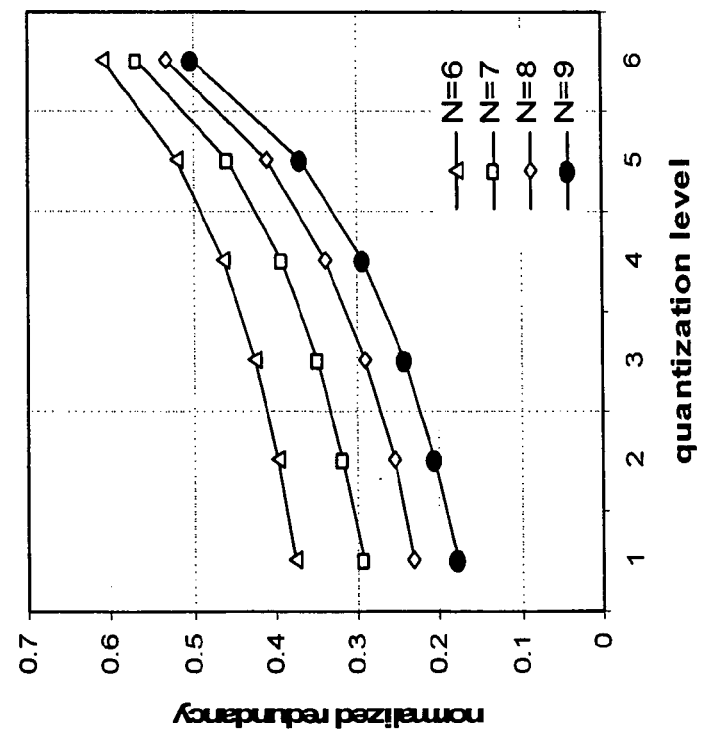

This mechanism is shown in FIG. 12 which depicts the normalized redundancy versus the quantization level (as expressed by Eq. 25), for practical instantiations of the $L_q$ and $N_q$ parameters. It is noticeable that the descriptions' redundancy decreases from the higher to the lower quantization levels, and moreover, by changing the parameters $L_q$ and $N_q$ we can speed the redundancy's rate-of-decay.

Figure 13:
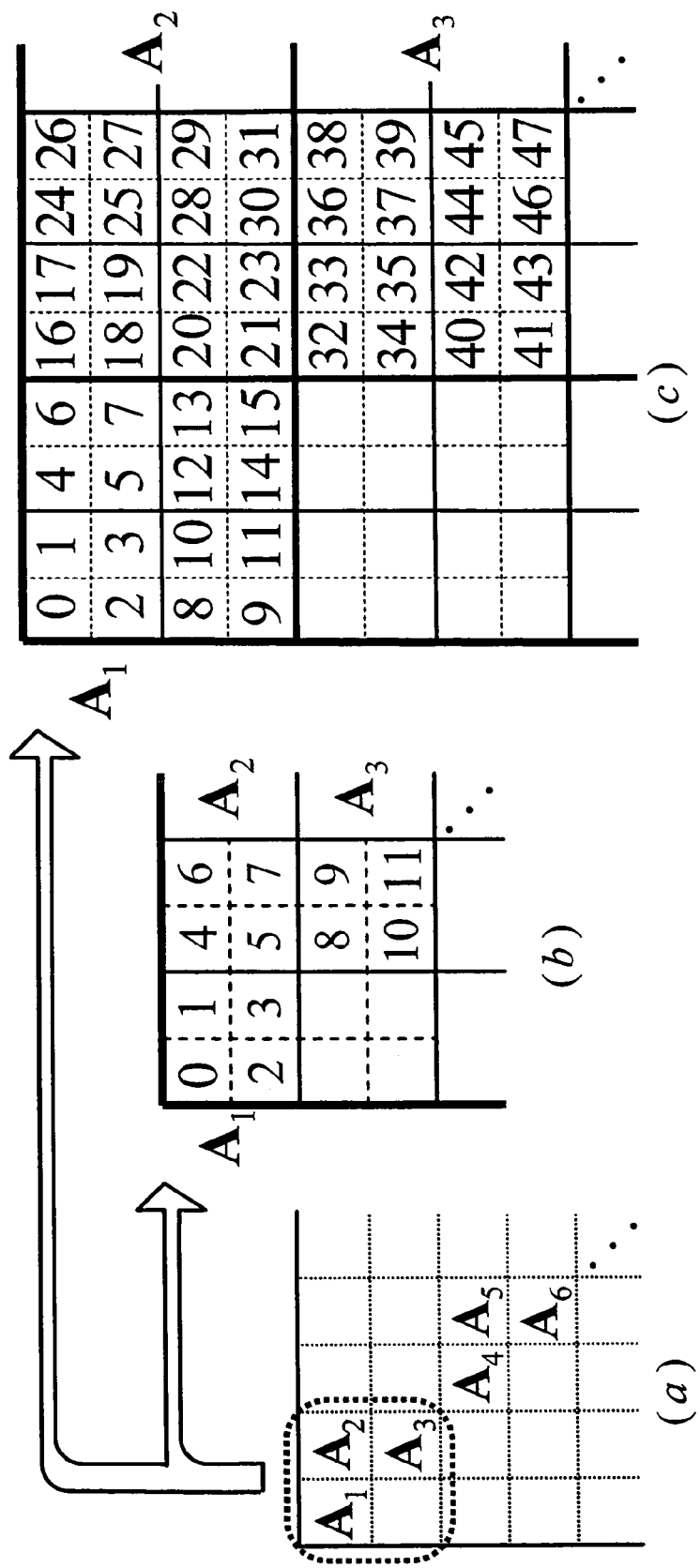
FIG. 13 shows an EMDSQ index assignment strategy for (b) one and (c) two quantization levels employing disconnected partition-cell high-rate quantizers according to an embodiment of the present invention.

In order to demonstrate the redundancy control mechanism in accordance with the above embodiments of the present invention the rate-distortion behavior for several instantiations of the generic family of EMDSQ has been determined. The EMDSQ instantiations employ one (K=0), two (K=1) and three (K=2) quantization levels with disconnected partition-cell quantizers. In all the cases $L_q=2$ and $N_q=4$ for any $q, 0 \leq q \leq K$. The corresponding index assignment is illustrated in FIG. 13.

The EMDSQ instantiations have been applied on a memoryless Laplacian source of random generated numbers with zero mean and $\sigma=44.7$, modeling a wavelet subband.

Figure 14:
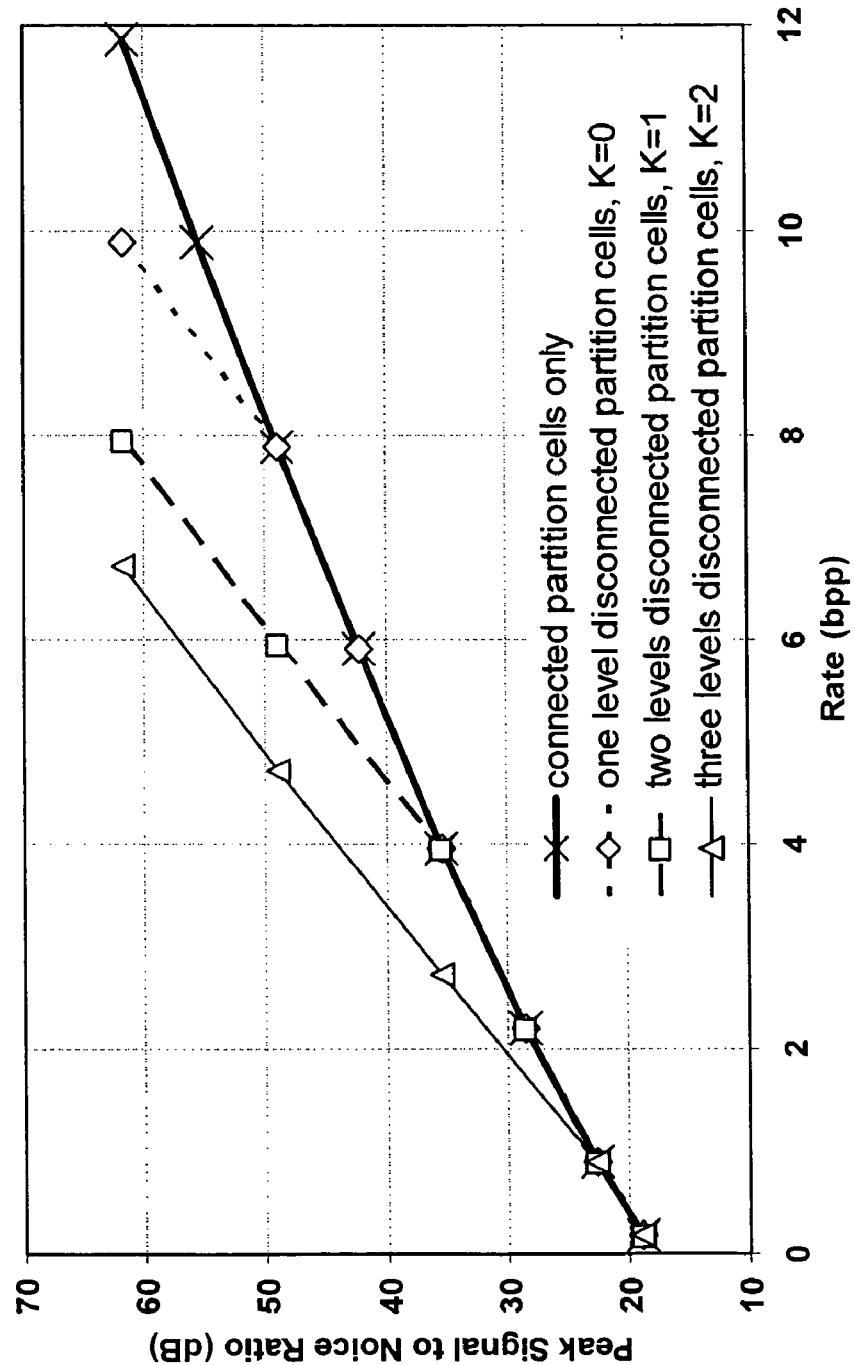
FIG. 14 shows a comparative central-channel rate-distortion performance for EMDSQ, without disconnected partition-cells and with one (K=0), two (K=1) and three (K=2) quantization levels with disconnected partition-cell quantizers according to embodiments of the present invention.

FIG. 14 shows that it is possible to speed the distortion's rate-of-decay for the central channel by decreasing, after a quantization level, the redundancy obtained by varying the standard deviation within a broad range of values ($12 < \sigma < 90$).

EMDSQ instantiations according to the present embodiment have also been incorporated in a practical wavelet coding system that entropy codes the quantizer indices using the QuadTree coding algorithm. The central-channel rate-distortion performances obtained with the different EMDSQ instantiations have been applied on a common data set for Lena and Goldhill images. The proposed EMDSQ family according to this embodiment allows for controlling the redundancy between two descriptions at each quantization level.

Figure 15:
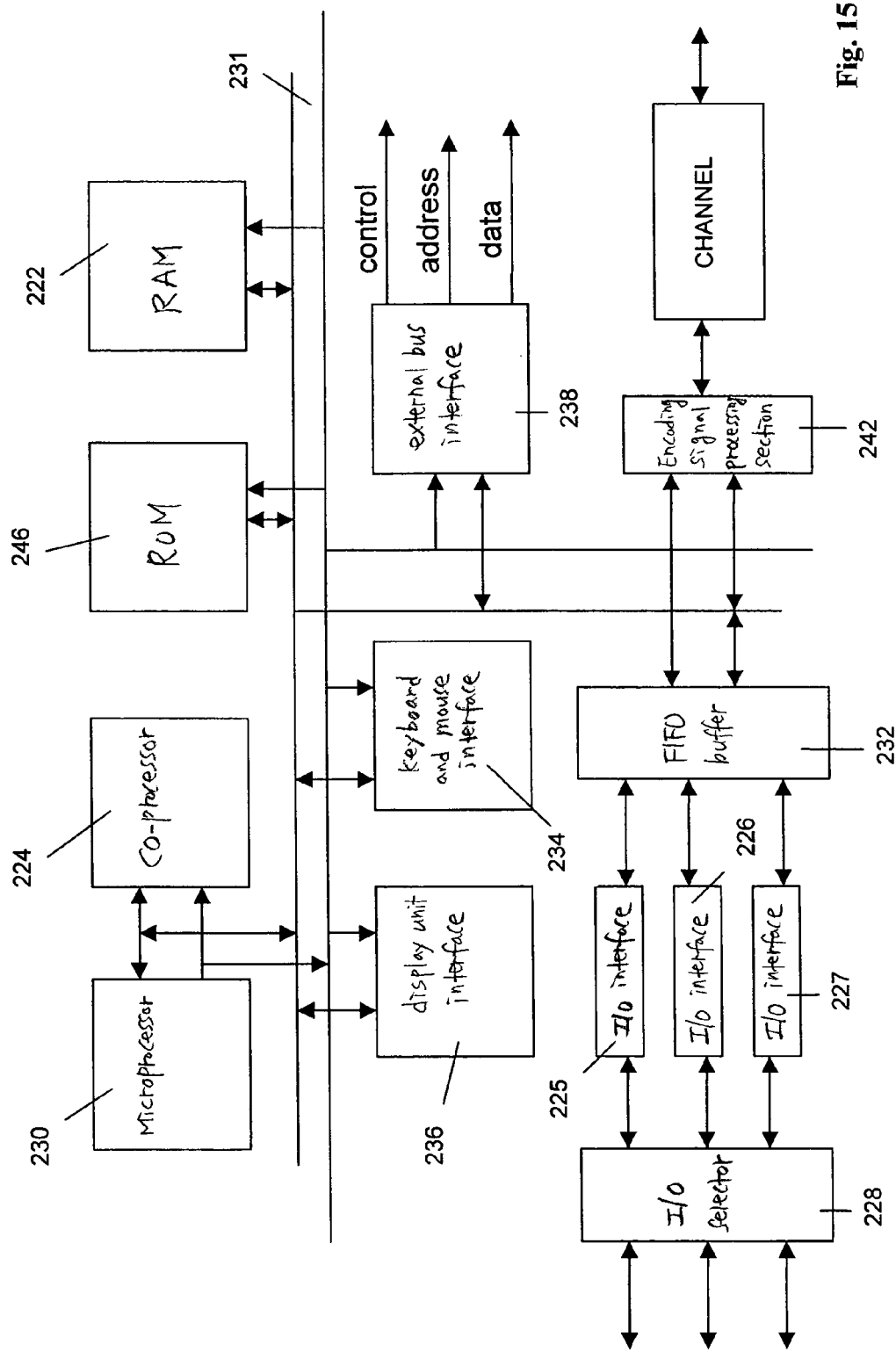
FIGS. 15 and 16 show implementations of embodiments of the present invention in computers and embedded processors.

FIG. 15 shows the implementation of a coder/decoder which can be used with embodiments of the invention implemented using a microprocessor 230 such as a Pentium IV from Intel Corp. USA, e.g. in a Personal Computer. The microprocessor 230 may have an optional element such as a co-processor 224, e.g. for arithmetic operations or microprocessor 230-224 may be a bit-sliced processor. A RAM memory 222 may be provided, e.g. DRAM. Various I/O (input/output) interfaces 225, 226, 227 may be provided, e.g. UART, USB, I²C bus interface as well as an I/O selector 228. These may serve to receive a source digital signal. FIFO buffers 232 may be used to decouple the processor 230 from data transfer through these interfaces. A keyboard and mouse interface 234 will usually be provided as well as a visual display unit interface 236. Access to an external memory such as a disk drive may be provided via an external bus interface 238 with address, data and control busses. The various blocks of the circuit are linked by suitable busses 231. The interface to the channel is provided by block 242 which can handle the encoded signals as well as transmitting to and receiving from the channel. Encoded data received by block 242 is passed to the processor 230 for processing.

Alternatively, the circuit of FIG. 15 may be constructed as a VLSI chip around an embedded microprocessor 230 such as an ARM7TDMI core designed by ARM Ltd., UK which may be synthesized onto a single chip with the other components shown. A zero wait state SRAM memory 222 may be provided on-chip as well as an optional cache memory 224. Various I/O (input/output) interfaces 225, 226, 227 may be provided, e.g. UART, USB, I²C bus interface as well as an I/O selector 228. FIFO buffers 232 may be used to decouple the processor 230 from data transfer through these interfaces. A counter/timer block 234 may be provided as well as an interrupt controller 236. Access to an external memory may be provided an external bus interface 238 with address, data and control busses. The various blocks of the circuit are linked by suitable busses 231. The interface to the channel is provided by block 242 which can handle the encoded signals as well as transmitting to and receiving from the channel. Encoded data received by block 242 is passed to the processor 230 for processing.

Software programs may be stored in an internal ROM (read only memory) 246. Software programs for carrying out coding and/or encoding, especially the quantizing and dequantizing in accordance with one embodiment of the present invention, including redundancy control may also be stored on the system in executable form. In particular software programs may be provided for quantizing and dequantizing as well as redundancy control according to embodiments of the present invention described above to be applied to blocks of data to generate two or more streams of encoded data. That is the software, for executing on the processor 230 has code for carrying out the function of quantizing a source digital signal to generate with different quantizations at least a first and a second bit-stream, of which at least one bit-stream has been generated by an embedded quantization, transmitting at least one of the at least first and second bit-streams and generating a dequantized digital signal from at least parts of one of the transmitted at least first and second bit streams, whereby if in the generation of the dequantized digital signal the parts of the at least first and second bit-streams are combined, the combined dequantized signal is generated by an embedded dequantizer having at least two quantization levels and having at least one quantization interval at each quantization level which is finer than quantization intervals for dequantizing any of the at least first and second bit-streams. Further, code for redundancy control may be provided.

Code may be provided so that each quantization level has a quantization rate and at least one bit-stream generated by an embedded quantization is generated by an embedded quantization where at least two quantization intervals at lower quantization rate are split into a different number of quantization intervals at a higher quantization rate. Code may also be provided so that at least one bit-stream generated by an embedded quantization is generated by a non-uniform embedded quantization. Code may also be provided so that at least one bit-stream generated by a non-uniform embedded quantization is generated by a non-uniform embedded dead zone quantization. Code may be provided so that at least one bit-stream generated by a non-uniform embedded dead zone quantization is generated by a non-uniform embedded double dead zone quantization. NCode may be provided so that at least one bit-stream generated by an embedded quantization is generated by a uniform embedded quantization. Code may be provided so that at least one bit-stream generated by a uniform embedded quantization is generated by a uniform embedded dead zone quantization. Code may also be provided so that at least one bit-stream generated by a uniform embedded dead zone quantization is generated by a uniform embedded double dead zone quantization. each bit-stream is generated by an embedded quantization.

The methods described above may be written as computer programs in a suitable computer language such as C and then compiled for the specific processor in the design. For example, for the embedded ARM core VLSI described above the software may be written in C and then compiled using the ARM C compiler and the ARM assembler. Reference is made to "ARM System-on-chip", S. Furber, Addison-Wiley, 2000. One aspect of the invention includes a data carrier on which is stored executable code segments, which when executed on a processor such as 230 will execute any of the methods according to embodiments of the invention, in particular will execute quantizing and/or dequantizing as well as redundancy control according to embodiments of the present invention described above to be applied to images. The data carrier may be any suitable data carrier such as diskettes ("floppy disks"), optical storage media such as CD-ROMs, DVD ROM's, tape drives, hard drives, etc. which are computer readable.

Figure 16:
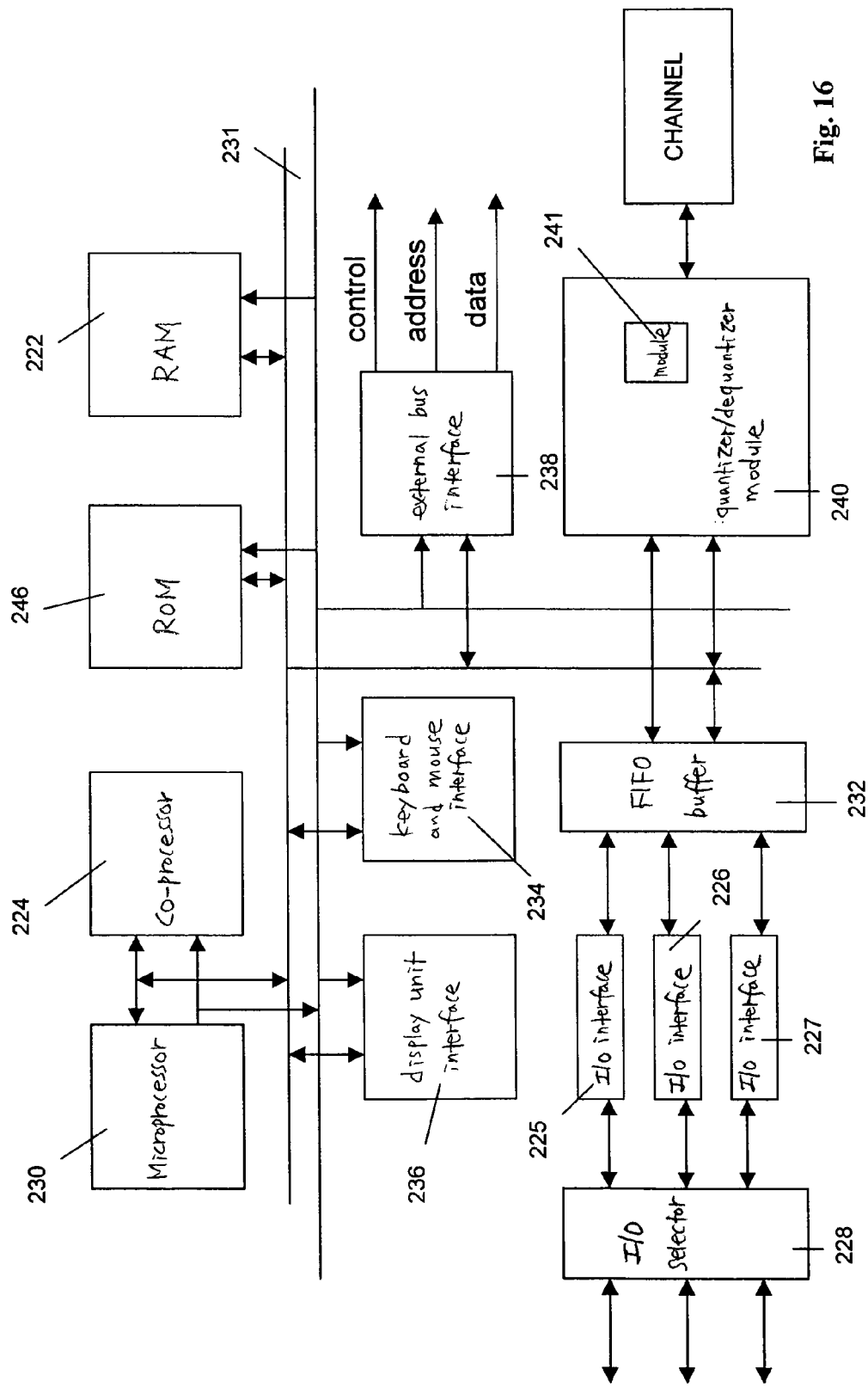

FIG. 16 shows the implementation of a coder/decoder which can be used with embodiments of the invention implemented using a dedicated quantizer/dequantizer module. Reference numbers in FIG. 16 which are the same as the reference numbers in FIG. 10 refer to the same components—both in the microprocessor and the embedded core embodiments.

Only the major differences in FIG. 16 will be described with respect to FIG. 15. Instead of the microprocessor 230 carrying out methods according to one embodiment of the invention this work is now taken over by a quantizer/dequantizer module 240. Module 240 may be constructed as an accelerator card for insertion in a personal computer. The module 240 has means for carrying out signal coding and/or decoding according to embodiments of the present invention described above. These coders and encoders may be implemented as a separate module 241, e.g. an ASIC (Application Specific Integrated Circuit) or an FPGA (Field Programmable Gate Array) having means for quantizing and/or dequnatizing according to embodiments of the present invention.

Similarly, if an embedded core is used such as an ARM processor core or an FPGA, a module 240 may be used which may be constructed as a separate module in a multi-chip module (MCM), for example or combined with the other elements of the circuit on a VLSI. The module 240 has means for carrying out quantising and/or dequantizing according to embodiments of the present invention. As above, these qunatizers/dequantizers may be implemented as a separate module 241, e.g. an ASIC (Application Specific Integrated Circuit) or an FPGA (Field Programmable Gate Array) having means for quantizing and/or dequantizing according to embodiments of the present invention described above.

While the invention has been shown and described with reference to preferred embodiments, it will be understood by those skilled in the art that various changes or modifications in form and detail may be made without departing from the scope and spirit of this invention.

The invention claimed is:

1. A method of transmitting a digital signal, comprising:
   quantizing a source digital signal to generate at least a first and a second bit-stream each having a different quantization, wherein at least one of the first and second bit-streams has been generated by embedded quantization;
   transmitting at least one of the at least first and second bit-streams; and
   generating a dequantized digital signal from at least parts of one of the transmitted at least first and second bit streams;
   wherein the generating comprises combining the parts of the at least first and second bit-streams, the combined dequantized signal being generated by embedded dequantization in which at least two quantization levels and at least one quantization interval, at each quantization level, are provided, and wherein the at least one quantization interval is shorter than quantization intervals for dequantizing any of the at least first and second bit-streams.

2. The method of claim 1, wherein each quantization level has a quantization rate and the at least one bit-stream is generated by embedded quantization where at least two quantization intervals at a same lower quantization rate are split into a different number of quantizationintervals at a same higher quantization rate.

3. The method of claim 2, wherein the at least one bit-stream is generated by non-uniform embedded quantization.

4. The method of claim 3, wherein the at least one bit-stream is generated by non-uniform embedded dead zone quantization.

5. The method of claim 4, wherein the at least one bit-stream is generated by non-uniform embedded double dead zone quantization.

6. The method of claim 1, wherein the at least one bit-stream is generated by uniform embedded quantization.

7. The method of claim 6, wherein the at least one bit-stream is generated by uniform embedded dead zone quantization.

8. The method of claim 7, wherein the at least one bit-stream is generated by uniform embedded double dead zone quantization.

9. The method of claim 1, wherein each bit-stream is generated by embedded quantization.

10. The method of claim 1, further comprising selecting end points of quantization intervals of a quantizer such that at least one of the end points does not coincide with end points of a quantization interval of another quantizer.

11. The method of claim 1, wherein the embedded quantization comprises at least three quantization levels.

12. The method of claim 1, wherein the quantizing of the source digital signal comprises embedded successive approximation quantization at every quantization level.

13. The method of claim 1, further comprising controlling redundancy for each quantization level.

14. A device for transmitting a digital signal, comprising:
a quantizer configured to quantize a source digital signal to generate at least a first and a second bit-stream each having a different quantization, wherein at least one of the first and second bit-streams has been generated by embedded quantization; and
a transmitter configured to transmit at least one of the at least first and second bit-streams, the quantizer being configured such that when a dequantized digital signal is generated from at least parts of one of the transmitted at least first and second bit streams, the pans of the at least first and second bit-streams are combined, the combined dequantized signal being generated by embedded dequantization in which at least two quantization levels and at least one quantization interval, at each quantization level, are provided, wherein the at least one quantization interval is shorter than quantization intervals for dequantizing any of the at least first and second bit-streams.

15. A device for receiving a digital signal, comprising:
a receiver configured to receive at least a first and a second bit-stream; and
a dequantizer configured to generate a dequantized digital signal from the received first and second bit-streams, wherein the dequantizer is further configured to combine, in the generation of the dequantized digital signal, the at least first andsecond bit-streams, the combined dequantized signal being generated by embedded dequantization in which at least two quantization levels and at least one quantization interval, at each quantization level, are provided, and wherein the at least one quantization interval is shorter than quantization intervals for dequantizing any of the at least first and second bit-streams.

16. Two or more signals generated by a method of transmitting a digital signal, wherein the method comprises:
quantizing a source digital signal to generate at least a first and a second bit-stream each having a different quantization, wherein at least one of the first and second bit-streams has been generated by embedded quantization;
transmitting at least one of the at least first and second bit-streams; and
generating a dequantized digital signal from at least parts of one of the transmitted at least first and second bit streams;
wherein the generating comprises combining the parts of the at least first and second bit-streams, the combined dequantized signal being generated by embedded dequantization in which at least two quantization levels and at least one quantization interval, at each quantization level, are provided, and wherein the at least one quantization interval is shorter than quantization intervals for dequantizing any of the at least first and second bit-streams.

17. The device of claim 14, wherein the device is integrated in a node of a telecommunications network.

18. The device of claim 15, wherein the device is integrated in a node of a telecommunications network.

19. The device of claim 14, wherein the device is integrated in a telecommunications network.

20. The device of claim 15, wherein the device is integrated in a telecommunications network.

21. A computer readable medium for storing executable codes, wherein the executable codes are configured to transmit a digital signal and wherein the medium comprises:
a code configured to quantize a source digital signal to generate at least a first and a second bit-stream each having a different quantization, wherein at least one of the first and second bit-streams has been generated by embedded quantization;
a code configured to transmit at least one of the at least first and second bit-streams; and
a code configured to generate a dequantized digital signal from at least parts of one of the transmifted at least first and second bit streams,
wherein the parts of the at least first and second bit-streams are combined, the combined dequantized signal being generated by embedded dequantization in which at least two quantization levels and at least one quantization interval, at each quantization level, and wherein the at least one quantization interval is shorter than quantization intervals for dequantizing any of the at least first and second bit-streams.

22. A method of receiving a digital signal, comprising:
receiving at least a first and a second bit-stream; and
generating a dequantized digital signal from the received first and second bit-streams, wherein the at least first and second bit-streams are combined, the combined dequantized signal being generated by embedded dequantization in which at least two quantization levels and at least one quantization interval, at each quantization level, are provided, and wherein the at least one quantization interval is shorter than quantization intervals for dequantizing any of the at least first and second bit-streams.

23. The method of claim 1, wherein the embedded quantization comprises at least seven quantization levels.

24. The method of claim 1, wherein the embedded quantization comprises at least ten quantization levels.

25. A device for receiving a digital signal, comprising:
means for receiving at least a first and a second bit-stream; and
means for generating a dequantized digital signal from the received first and second bit-streams, wherein the generating means is configured to combine at least first and second bit-streams, the combined dequantized signal being generated by embedded dequantization in which at least two quantization levels and at least one quantization interval, at each quantization level, are provided, and wherein the at least one quantization interval is shorter than quantization intervals for dequantizing any of the at least first and second bit-streams.

26. A device for receiving a digital signal, comprising:
an I/O interface configured to receive at least a first and a second bit-stream;
a memory which stores a program, wherein the program is configured to generate a dequantized digital signal from the received first and second bit-streams, wherein the at least first and second bit-streams are combined, the combined dequantized signal being generated by embedded dequantization in which at least two quantization levels and at least one quantization interval, at each quantization level, are provided, and wherein the at least one quantization interval is shorter than quantization intervals for dequantizing any of the at least first and second bit-streams; and
a microprocessor configured to execute the program stored in the memory.

27. A device for receiving a digital signal, comprising:
an I/O interface configured to receive at least a first and a second bit-stream; and
a dequantizer module configured to generate a dequantized digital signal from the received first and second bit-streams, wherein the dequantizer module is further configured to combine at least first and second bit-streams, the combined dequantized signal being generated by embedded dequantization in which at least two quantization levels and at least one quantization interval, at each quantization level, are provided, and wherein the at least one quantization interval is shorter than quantization intervals for dequantizing any of the at least first and second bit-streams.

\* \* \* \* \*

UNITED STATES PATENT AND TRADEMARK OFFICE
CERTIFICATE OF CORRECTION

| | |
|---|---|
| PATENT NO. | : 7,356,085 B2 |
| APPLICATION NO. | : 10/813811 |
| DATED | : April 8, 2008 |
| INVENTOR(S) | : Gavrilescu et al. |

It is certified that error appears in the above-identified patent and that said Letters Patent is hereby corrected as shown below:

At sheet 11 or 13 (Fig. 14), line 1, delete "Noice" and insert -- Noise --, therefor.

At column 1, line 13, after "signals" insert -- . --.

At column 1, line 49, delete "CAtf" and insert -- CAtf. --, therefor.

At column 2, line 4, delete "CAtf" and insert -- CAtf. --, therefor.

At column 2, line 12, delete "CAtf" and insert -- CAtf. --, therefor.

At column 2, line 19, delete "n∈z30" and insert -- n∈z+ --, therefor.

At column 2, line 29, delete "$Q_C^1(x)$" and insert -- $Q_S^1(x)$ --, therefor.

At column 2, line 31, delete "$(q_k^1)$," and insert -- $(q_k^1)$ --, therefor.

At column 3, line 6, delete "$k_{p-}$," and insert -- $k_{p-1}$, --, therefor.

At column 8, line 3, delete "$N^q$" and insert -- $N_q$ --, therefor.

At column 9, line 11, delete "channel a." and insert -- channel ≈. --, therefor.

At column 9, line 65, delete "$Q_{S1,1}$" and insert -- $Q_S^{1,1}$, --, therefor.

At column 10, line 22, delete "$S^{0,02,0}$" and insert -- $S_{0,0}^{2,0}$ --, therefor.

At column 11, line 7, after "a≤x≤b" insert -- . --.

At column 11, line 9, delete "$y_{k-\Delta/2}$];" and insert -- $y_k$–Δ/2]; --, therefor.

At column 11, line 56, delete "$B^{Infm,p}$" and insert -- $B_{Inf}^{m,p}$ --, therefor.

At column 12, line 27, delete "$R_0$," and insert -- $R_0$ --, therefor.

At column 13, line 42, delete "v±(1,1)" and insert -- v≠(1,1) --, therefor.

UNITED STATES PATENT AND TRADEMARK OFFICE
CERTIFICATE OF CORRECTION

PATENT NO. : 7,356,085 B2
APPLICATION NO. : 10/813811
DATED : April 8, 2008
INVENTOR(S) : Gavrilescu et al.

It is certified that error appears in the above-identified patent and that said Letters Patent is hereby corrected as shown below:

At column 14, line 56, delete "$m1 \leq m \leq 2$" and insert -- $m, 1 \leq m \leq 2$ --, therefor.

At column 14, line 64, delete "$T=^{[\log 2(wmax/3)]+1}$" and insert -- $T=2^{[\log 2(wmax/3)]+1}$ --, therefor.

At column 14, line 67, delete "(wmax/3)" and insert -- ($w_{max}/3$) --, therefor.

At column 15, line 9, delete "$x \leq 1.$" and insert -- $x \geq 1.$ --, therefor.

At column 15, line 12, delete "$(x \epsilon [0,24))$." and insert -- $(x \epsilon [0,24])$. --, therefor.

At column 15, line 55, after "$^{(P-x)}$" insert -- . --.

At column 17, line 32, delete "$1 \leq r \cdot \leq 3N,$" and insert -- $1 \leq r \leq 3N$, --, therefor.

At column 17, line 54, delete "$\Delta_C \Delta \square_+^*$" and insert -- $\Delta_C \epsilon \square_+^*$ --, therefor.

At column 18, line 3, delete "$\Delta^{(K+l)})$" and insert -- $\Delta^{(K+1)}$ --, therefor.

At column 18, line 3, delete "$\Delta^{(K+}1)$" and insert -- $\Delta^{(K+1)}$ --, therefor.

At column 18, line 4, delete "$\Delta^{(K+}1)$" and insert -- $\Delta^{(K+1)}$ --, therefor.

At column 18, line 20, delete "$A_r,$" and insert -- $A_r$ --, therefor.

At column 18, line 28 (approx.), delete " $B_{L_K L_K}$ " and insert -- $B_{L_K L_K}^K$ --, therefor.

At column 18, line 35, after "$L_{K-1}$)" insert -- . --.

At column 18, line 41, delete "$\pm$" and insert -- $\neq$ --, therefor.

At column 18, line 42, delete "$\pm$" and insert -- $\neq$ --, therefor.

At column 18, line 44, delete "$L_{q+},$" and insert -- $L_{q+1}$, --, therefor.

UNITED STATES PATENT AND TRADEMARK OFFICE
CERTIFICATE OF CORRECTION

PATENT NO. : 7,356,085 B2
APPLICATION NO. : 10/813811
DATED : April 8, 2008
INVENTOR(S) : Gavrilescu et al.

It is certified that error appears in the above-identified patent and that said Letters Patent is hereby corrected as shown below:

At column 18, line 54, delete "$1 \leq i, j\ i \leq L_0$" and insert -- $1 \leq i,j \leq L_0$ --, therefor.

At column 18, line 58, delete "$A_C^{(q)}$" and insert -- $\Delta_C^{(q)}$ --, therefor.

At column 18, line 60, delete "$\pm$" and insert -- $\neq$ --, therefor.

At column 18, line 66, delete "the" and insert -- $1 \leq i,j \leq L_q$, the --, therefor.

At column 19, line 3, delete "$\Pi_{k=0}^{q-1}$," and insert -- $\Pi_{k=0}^{q-1} N_k$, --, therefor.

At column 19, line 6, delete "$3 \cdot 2^{P \cdot \Pi}$" and insert -- $3 \cdot 2^P \cdot \Pi$ --, therefor.

At column 19, line 13, delete "$q-1(q)$" and insert -- $q-1-l(q)$ --, therefor.

At column 19, line 24 (approx.) delete "$D_o$for" and insert -- $D_o$ for --, therefor.

At column 19, line 33, delete "(2·2" and insert -- (3·2 --, therefor.

At column 19, line 35, before "K" insert -- $\leq$ --.

At column 19, line 36, delete "$\rho_q = 2\log_2$" and insert -- $\rho_q = 2 \cdot \log_2$ --, therefor.

At column 19, line 44, delete "$\rho_q = 2\log_2$" and insert -- $\rho_q = 2 \cdot \log_2$ --, therefor.

At column 19, line 61, delete "q,0q$\leq$q$\leq$K," and insert -- q,0$\leq$q$\leq$K, --, therefor.

At column 21, line 54, delete "each" and insert -- Each --, therefor.

At column 23, line 5, in Claim 2, delete "quantizationintervals" and insert -- quantization intervals --, therefor.

At column 23, line 47, in Claim 14, delete "pans" and insert -- parts --, therefor.

UNITED STATES PATENT AND TRADEMARK OFFICE
CERTIFICATE OF CORRECTION

PATENT NO. : 7,356,085 B2
APPLICATION NO. : 10/813811
DATED : April 8, 2008
INVENTOR(S) : Gavrilescu et al.

It is certified that error appears in the above-identified patent and that said Letters Patent is hereby corrected as shown below:

At column 23, line 63, in Claim 15, delete "andsecond" and insert -- and second --, therefor.

At column 24, line 44, in Claim 21, delete "transmifted" and insert -- transmitted --, therefor.

Signed and Sealed this

Seventh Day of April, 2009

JOHN DOLL
*Acting Director of the United States Patent and Trademark Office*